(12) United States Patent
Choi et al.

(10) Patent No.: US 12,096,615 B2
(45) Date of Patent: *Sep. 17, 2024

(54) SEMICONDUCTOR DEVICES HAVING CONTACT PLUGS

(71) Applicant: Samsung Electronics Co., Ltd., Suwon-si (KR)

(72) Inventors: Wooyoung Choi, Seoul (KR); Juseong Oh, Seoul (KR); Yoosang Hwang, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/368,939

(22) Filed: Sep. 15, 2023

(65) Prior Publication Data

US 2024/0008260 A1  Jan. 4, 2024

Related U.S. Application Data

(63) Continuation of application No. 17/568,440, filed on Jan. 4, 2022, now Pat. No. 11,785,763.

(30) Foreign Application Priority Data

Jun. 14, 2021 (KR) .......................... 10-2021-0076645

(51) Int. Cl.
  *H01L 23/522* (2006.01)
  *G11C 5/10* (2006.01)
  (Continued)

(52) U.S. Cl.
  CPC .............. *H10B 12/37* (2023.02); *G11C 5/10* (2013.01); *H01L 23/5226* (2013.01); *H01L 23/528* (2013.01); *H01L 28/60* (2013.01)

(58) Field of Classification Search
  CPC . H01L 23/522; H01L 23/528; H01L 23/5226; H01L 23/5283; H01L 21/768;
  (Continued)

(56) References Cited

U.S. PATENT DOCUMENTS 6,696,720 B2  2/2004  Sakao
7,852,675 B2  12/2010  Maejima
(Continued)

FOREIGN PATENT DOCUMENTS

KR  20100111468 A  10/2010
TW  543157 B  7/2003

OTHER PUBLICATIONS

Office Action issued Jan. 10, 2023 for corresponding application TW 111106041.

*Primary Examiner* — Chuong A Luu
(74) *Attorney, Agent, or Firm* — Muir Patent Law, PLLC

(57) ABSTRACT

A semiconductor device includes a substrate including a cell area having a first active region and a peripheral circuit area having a second active region, a direct contact contacting the first active region in the cell area, a bit line structure disposed on the direct contact, a capacitor structure electrically connected to the first active region, a gate structure disposed on the second active region in the peripheral circuit area, lower wiring layers disposed adjacent to the gate structure and electrically connected to the second active region, upper wiring layers disposed on the lower wiring layers, a wiring insulating layer disposed between the lower wiring layers and the upper wiring layers, and upper contact plugs connected to at least one of the lower wiring layers and the upper wiring layers and extending through the wiring insulating layer.

21 Claims, 27 Drawing Sheets

(51) Int. Cl.
*H01L 23/528* (2006.01)
*H01L 49/02* (2006.01)
*H10B 12/00* (2023.01)

(58) Field of Classification Search
CPC ........... H01L 21/76897; H01L 21/8234; H01L 21/823475; H01L 28/60; H01L 28/90; H10B 12/00; H10B 12/37; H10B 12/09; H10B 12/50; H10B 12/482; H10B 12/315
USPC ........................................................ 257/296
See application file for complete search history.

(56) References Cited

U.S. PATENT DOCUMENTS

| | | |
|---|---|---|
| 8,674,420 B2 | 3/2014 | Yeom |
| 9,087,728 B2 | 7/2015 | Chung et al. |
| 10,804,277 B2 | 10/2020 | Kim et al. |
| 11,785,763 B2 * | 10/2023 | Choi ........................ H01L 28/60 257/296 |
| 2010/0155799 A1 | 6/2010 | Yokoyama |
| 2011/0117718 A1 | 5/2011 | Nakamura et al. |
| 2011/0278668 A1 | 11/2011 | Kim |
| 2012/0012911 A1 | 1/2012 | Jeong |
| 2012/0156849 A1 | 6/2012 | Yu |
| 2012/0281490 A1 | 11/2012 | Cho |
| 2018/0358363 A1 | 12/2018 | Nagai |
| 2021/0272961 A1 | 9/2021 | Tung et al. |

\* cited by examiner

SEMICONDUCTOR DEVICES HAVING CONTACT PLUGS

CROSS-REFERENCE TO THE RELATED APPLICATION

This application is a continuation of and claims priority to U.S. patent application Ser. No. 17/568,440 filed Jan. 4, 2022, which claims priority from Korean Patent Application No. 10-2021-0076645, filed on Jun. 14, 2021, in the Korean Intellectual Property Office, the disclosures of which are incorporated herein by reference in their entirety.

BACKGROUND

1. Field

The exemplary embodiments of the disclosure relate to a semiconductor device having a contact plug.

2. Description of the Related Art

In accordance with demand for high integration and miniaturization of a semiconductor device, such a semiconductor device is being scaled down in size. Accordingly, a semiconductor memory device used in an electronic appliance also requires high integration and, as such, design rules for constituent elements of the semiconductor memory device are reduced. For example, technology for reducing the size of the device through disposition of wirings within a narrow space in a core/peri area is needed.

SUMMARY

The exemplary embodiments of the disclosure provide an upper wiring layer and an upper contact plug.

A semiconductor device according to exemplary embodiments of the disclosure may include a substrate extending in a first direction and a second direction perpendicular to the first direction, and including a cell area having a first active region and a peripheral circuit area having a second active region, a direct contact contacting the first active region in the cell area, a bit line structure disposed on the direct contact, a capacitor structure electrically connected to the first active region, a gate structure disposed on the second active region in the peripheral circuit area, lower wiring layers disposed adjacent to the gate structure and electrically connected to the second active region, upper wiring layers disposed on the lower wiring layers, a wiring insulating layer disposed between the lower wiring layers and the upper wiring layers, and upper contact plugs connected to at least one of the lower wiring layers and the upper wiring layers and extending through the wiring insulating layer in a third direction perpendicular to the first direction and the second direction.

A semiconductor device according to exemplary embodiments of the disclosure may include a substrate extending in a first direction and a second direction perpendicular to the first direction, and including a cell area having a first active region and a peripheral circuit area having a second active region, a direct contact contacting the first active region in the cell area, a bit line structure disposed on the direct contact, a capacitor structure electrically connected to the first active region, a plate layer covering the capacitor structure, a gate structure disposed on the second active region in the peripheral circuit area, lower wiring layers disposed adjacent to the gate structure and electrically connected to the second active region, upper wiring layers disposed on the lower wiring layers, a wiring insulating layer disposed between the lower wiring layers and the upper wiring layers, and upper contact plugs connected to at least one of the lower wiring layers and the upper wiring layers and extending through the wiring insulating layer in a third direction perpendicular to the first direction and the second direction. The plate layer may include a same material as the upper wiring layers.

A semiconductor device according to exemplary embodiments of the disclosure may include a substrate extending in a first direction and a second direction perpendicular to the first direction, and including a cell area having a first active region and a peripheral circuit area having a second active region, a direct contact contacting the first active region in the cell area, a bit line structure disposed on the direct contact, a capacitor structure electrically connected to the first active region, the capacitor structure including a lower electrode, a capacitor dielectric layer covering the lower electrode, and an upper electrode covering the capacitor dielectric layer, a plate layer covering the upper electrode, a capacitor contact plug connected to the plate layer, a gate structure disposed on the second active region in the peripheral circuit area, lower wiring layers disposed adjacent to the gate structure and electrically connected to the second active region, upper wiring layers disposed on the lower wiring layers, a wiring insulating layer disposed between the lower wiring layers and the upper wiring layers, and upper contact plugs connected to at least one of the lower wiring layers and the upper wiring layers and extending through the wiring insulating layer in a third direction perpendicular to the first direction and the second direction.

BRIEF DESCRIPTION OF THE DRAWINGS

The above and other objects, features, and advantages of the inventive concept will become more apparent to those skilled in the art upon consideration of the following detailed description with reference to the accompanying drawings.

DETAILED DESCRIPTION OF EXEMPLARY EMBODIMENTS

Figure 1:
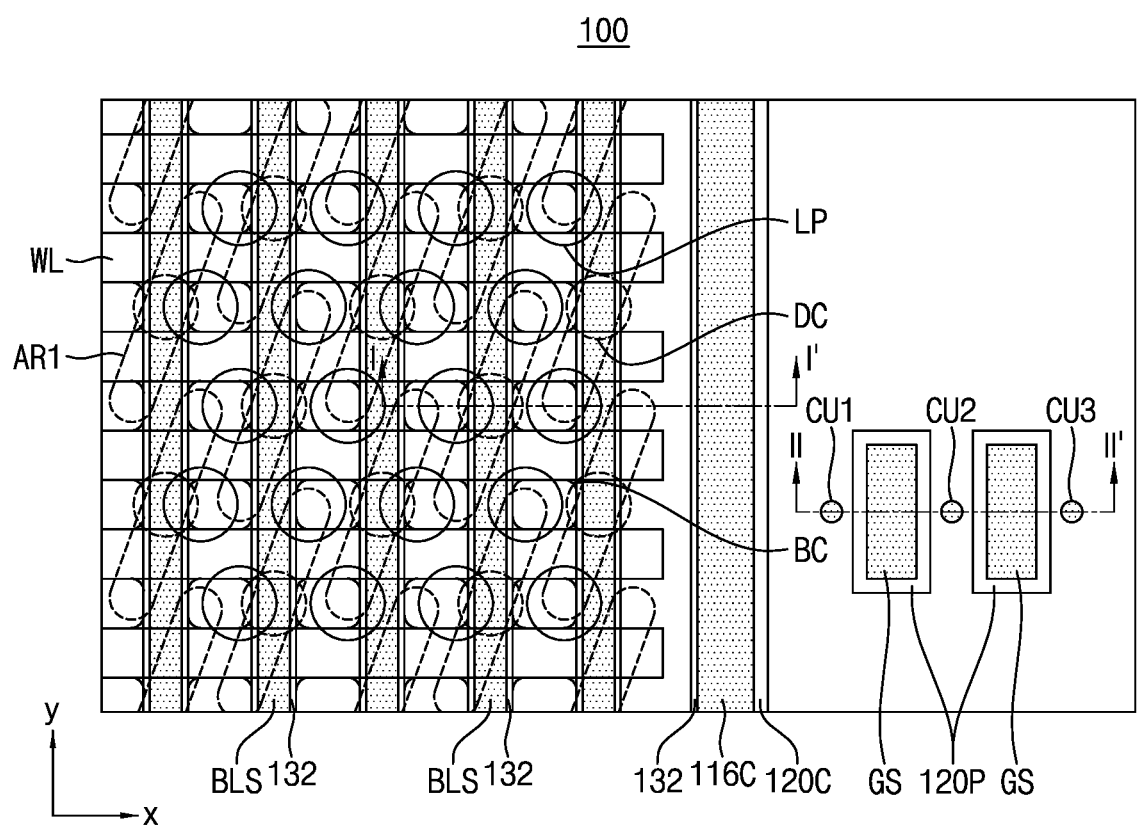
FIG. 1 is a plan view of a semiconductor device according to an example embodiment of the inventive concepts.
Figure 2:
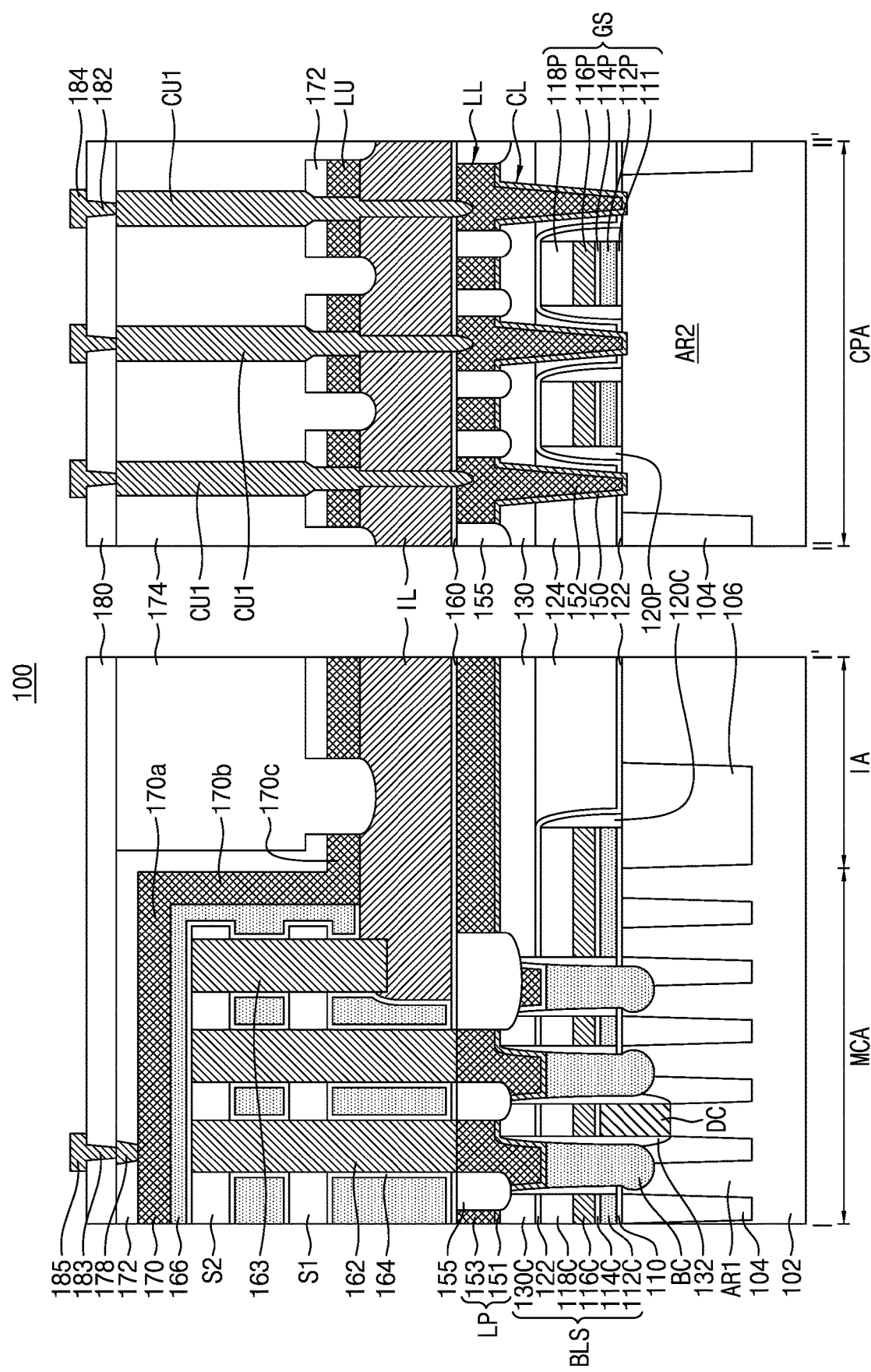
FIG. 2 are vertical cross-sectional views of the semiconductor device taken along lines I-I' and II-II' shown in FIG. 1.

FIG. 1 is a plan view of a semiconductor device according to an example embodiment of the inventive concepts. FIG. 2 are vertical cross-sectional views of the semiconductor device taken along lines I-I' and II-II' shown in FIG. 1.

Referring to FIGS. 1 and 2, a semiconductor device 100 may include a substrate 102, a gate electrode WL, a bit line structure BLS, a gate structure GS, an insulating spacer 132, a buried contact BC, a landing pad LP, a lower contact plug CL, a lower wiring layer LL, a lower electrode 162, a capacitor dielectric layer 164, an upper electrode 166, a wiring insulating layer IL, an upper wiring layer LU, and first upper contact plugs CU1.

The substrate 102 may include a cell area MCA, an interface area IA, and a peripheral circuit area CPA. The cell area MCA may represent an area in which a memory cell of a DRAM device is disposed. The interface area IA may be disposed between the cell area MCA and the peripheral circuit area CPA while surrounding the cell area MCA. The peripheral circuit area CPA may be a core/peri area. The substrate 102 may include or may be formed of a semiconductor material. For example, the substrate 102 may be a silicon substrate, a germanium substrate, a silicon germanium substrate, or a silicon-on-insulator (SOI) substrate.

The substrate 102 may include a first active region AR1, a second active region AR2, an element isolation layer 104, and a region isolation layer 106. The element isolation layer 104 may be an insulating layer extending downwards (i.e., lengthwise in a direction perpendicular to the x-direction and the y-direction) from an upper surface of the substrate 102, and may define first active regions AR1 in the cell area MCA. For example, the active regions AR1 may correspond to portions of the upper surface of the substrate 102 surrounded by the element isolation layer 104, respectively. When viewed in a plan view, the first active regions AR1 may have the form of a bar having a shorter axis and a longer axis, and may be spaced apart from one another. The element isolation layer 104 may define second active regions AR2 in the peripheral circuit area CPA. The region isolation layer 106 may be disposed in the interface area IA. The region isolation layer 106 may electrically insulate the first active region AR1 from a portion of the substrate 102 in the interface area IA. An item, layer, or portion of an item or layer described as extending "lengthwise" in a particular direction has a length in the particular direction and a width perpendicular to that direction, where the length is greater than the width.

When viewed in a plan view, gate electrodes WL extend in the x-direction while being spaced apart from one another in the y-direction. In addition, the gate electrodes WL may intersect the first active region AR1. For example, two gate electrodes WL may intersect one first active region AR1. The gate electrodes WL may be buried in the substrate 102, and, for example, may be disposed in trenches formed in the substrate 102, respectively. An upper surface of the gate electrode WL may be coplanar with upper surfaces of the element isolation layer 104 and the region isolation layer 106. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The semiconductor device 100 may further include a buffer layer 110 between the substrate 102 and the bit line structure BLS. The buffer layer 110 may cover the upper surfaces of the element isolation layer 104 and the region isolation layer 106. In an embodiment, the buffer layer 110 may include or may be formed of silicon nitride.

When viewed in a plan view, bit line structures BLS extend in the y-direction while being spaced apart from one another in the x-direction. The bit line structure BLS may have the form of a bar extending in the y-direction. When viewed in a cross-sectional view, the bit line structure BLS may include a first conductive layer 112C, a second conductive layer 114C, a third conductive layer 116C, a first capping layer 118C, an insulating liner 122, and a second capping layer 130C which are sequentially stacked on the buffer layer 110. The first conductive layer 112C, the second conductive layer 114C, the third conductive layer 116C, and the first capping layer 118C may extend in the y-direction, and may have substantially the same width when viewed in a cross-sectional view. The insulating liner 122 may cover the first capping layer 118C in the cell area MCA, and may extend to the interface area IA and the peripheral circuit area CPA. For example, the insulating liner 122 may cover the upper surfaces of the substrate 102 and the region isolation layer 106. The second capping layer 130C may cover the insulating liner 122 in the cell region MCA. A second capping layer 130 may be disposed at the same level as the second capping layer 130C, and may extend to the interface area IA and the peripheral circuit area CPA.

The first conductive layer 112C may include or may be formed of polysilicon, and each of the second conductive layer 114C and the third conductive layer 116C may include or may be formed of titanium nitride (TiN), titanium silicium nitride (TiSiN), tungsten (W), tungsten silicide, or a combination thereof. The first capping layer 118C, the insulating liner 122, and the second capping layer 130C may include or may be formed of silicon oxide, silicon nitride, silicon oxynitride, or a combination thereof. In an embodiment, the first capping layer 118C, the insulating liner 122, and the second capping layer 130C may include or may be formed of silicon nitride.

The buffer layer 110, the first conductive layer 112C, the second conductive layer 114C, the third conductive layer 116C, and the first capping layer 118C may further extend to the interface area IA. For example, ends of the buffer layer 110, the first conductive layer 112C, the second conductive layer 114C, the third conductive layer 116C, and the first capping layer 118C may be disposed on the region isolation layer 106.

The semiconductor device 100 may further include a direct contact DC disposed beneath the bit line structure BLS at a portion of the bit line structure BLS contacting the first active region AR1. For example, the direct contact DC may fill a recess formed at the upper surface of the substrate 102. When viewed in a plan view, the direct contact DC may contact a middle portion of the active region. An upper surface of the direct contact DC may be disposed at the same level as an upper surface of the first conductive layer 112C. The direct contact DC may electrically connect the first active region AR1 to the bit line structure BLS. For example, the direct contact DC may extend through the first conductive layer 112C of the bit line structure BLS, and may be electrically connected to the second conductive layer 114C and the third conductive layer 116C. The direct contact DC may include or may be formed of polysilicon.

The gate structure GS may be disposed on the second active region AR2 in the peripheral circuit area CPA. Although not shown, a source/drain region may be disposed at an upper surface of the second active region AR2 while being adjacent to the gate structure GS. The gate structure GS may include a gate dielectric layer 111, a first conductive layer 112P, a second conductive layer 114P, a third conductive layer 116P, and a first capping layer 118P which are sequentially stacked. The first conductive layer 112P, the second conductive layer 114P, the third conductive layer 116P, and the first capping layer 118P may include the same materials as the first conductive layer 112C, the second conductive layer 114C, the third conductive layer 116C, and the first capping layer 118C, respectively.

The semiconductor device 100 may further include an edge spacer 120C and a gate spacer 120P. The edge spacer 120C may cover the ends of the buffer layer 110, the first conductive layer 112C, the second conductive layer 114C, the third conductive layer 116C, and the first capping layer 118C. The edge spacer 120C may be disposed in the interface area IA, and, for example, may be disposed on the region isolation layer 106. The edge spacer 120C may be covered by the insulating liner 122 extending from the cell area MCA.

The gate spacer 120P may cover a side surface of the gate structure GS. For example, when viewed in a plan view, the gate spacer 120P may surround the gate structure GS. The gate structure GS and the gate spacer 120P may be covered by the insulating liner 122 extending from the cell area MCA. The gate spacer 120P may include the same material as the edge spacer 120C. For example, the edge spacer 120C and the gate spacer 120P may include or may be formed of silicon oxide, silicon nitride, silicon oxynitride, or a combination thereof.

The semiconductor device 100 may further include a lower interlayer insulating layer 124. The lower interlayer insulating layer 124 may be disposed on the insulating liner 122 in the interface area IA and the peripheral circuit area CPA, and may contact a lower surface of the second capping layer 130. In addition, the lower interlayer insulating layer 124 may be disposed at side surfaces of the edge spacer 120C and the gate spacer 120P. An upper surface of the lower interlayer insulating layer 124 may be coplanar with an upper surface of the insulating liner 122 in the cell area MCA. The lower interlayer insulating layer 124 may include or may be formed of silicon oxide, silicon nitride, silicon oxynitride, or a combination thereof.

Insulating spacers 132 may be disposed at opposite side surfaces of the bit line structures BLS, respectively, and may extend in the y-direction. A part of the insulating spacers 132 may extend into the recess of the substrate 102, and may cover a side surface of the direct contact DC. The insulating spacers 132 may be constituted by a single layer or multiple layers.

The buried contact BC may be disposed among the bit line structures BLS. An upper surface of the buried contact BC may be disposed at a lower level than an upper surface of the second capping layer 130C, and a lower portion of the buried contact BC may extend into the substrate 102. For example, a lower end of the buried contact BC may be disposed at a lower level than the upper surface of the substrate 102, and may contact the first active region AR1. The semiconductor device 100 may further include fence insulating layers (not shown) disposed alternately with the buried contact BC in the y-direction when viewed in a plan view. The fence insulating layers may overlap with the gate electrodes WL. The buried contact BC may include or may be formed of polysilicon.

The landing pad LP may be disposed on the bit line structure BLS, and may contact the buried contact BC. The landing pad LP may include a barrier pattern 151 and a conductive pattern 153. The barrier pattern 151 may be conformally formed along the upper surfaces of the bit line structure BLS and the buried contact BC, and the conductive pattern 153 may be disposed on the barrier pattern 151. For example, a lower surface of the conductive pattern 153 may be disposed at a lower level than the upper surface of the second capping layer 130C, and may correspond to the buried contact BC. An upper surface of the landing pad LP may be disposed at a higher level than the second capping layer 130C. The landing pad LP may be electrically connected to the active region via the buried contact BC.

The semiconductor device 100 may further include an insulating structure 155 disposed among the landing pads LP. The insulating structure 155 may electrically insulate the landing pads LP from one another. An upper surface of the insulating structure 155 may be coplanar with the upper surface of the landing pad LP. In an embodiment, the landing pad LP may include or may be formed of tungsten, and the insulating structure 155 may include or may be formed of silicon oxide. The barrier pattern 151 and the conductive pattern 153 of the landing pad LP may extend to the interface area LA. For example, the barrier pattern 151 and the conductive pattern 153 may be disposed on the second capping layer 130 in the interface area IA.

The lower contact plug CL and the lower wiring layer LL may be disposed adjacent to the gate structure GS in the peripheral circuit area CPA. The lower contact plug CL may contact the second active region AR2 while extending through the lower interlayer insulating layer 124 and the second capping layer 130. The lower wiring layer LL may be disposed on the lower contact plug CL, and may be electrically connected to the second active region AR2 via the lower contact plug CL. An upper surface of the lower wiring layer LL may be disposed at the same level as the upper surface of the landing pad LP, and the lower contact plug CL and the lower wiring layer LL may include the same material as the landing pad LP. For example, the lower contact plug CL and the lower wiring layer LL may include a conductive layer 152, and a barrier layer 150 surrounding a lower surface of the conductive layer 152. The lower contact plug CL may be materially in continuity with the lower wiring layer LL. For example, the barrier layer 150 and the conductive layer 152 constituting the lower contact plug CL may be materially in continuity with the barrier layer 150 and the conductive layer 152 constituting the lower wiring layer LL. In an embodiment, lower wiring layers LL may have the form of lines extending in a horizontal direction or the form of islands spaced apart from one another. The insulating structure 155 may electrically insulate the lower wiring layers LL from one another. As used herein, the term "materially in continuity" may refer to structures, patterns, and/or layers that are formed at the same time and of the same material, without a break in the continuity of the material of which they are formed. As one example, structures, patterns, and/or layers that are "materially in continuity" may be homogeneous monolithic structures.

The semiconductor device 100 may further include an etch stop layer 160 disposed on the landing pad LP, the insulating structure 155 and the lower wiring layer LL. The wiring insulating layer IL may be disposed on the etch stop layer 160 in the interface area IA and the peripheral circuit area CPA. The wiring insulating layer IL may include a recess at an upper surface thereof. In an embodiment, the wiring insulating layer IL may further extend to the cell region MCA. The etch stop layer 160 and the wiring insulating layer IL may include or may be formed of silicon nitride.

A capacitor structure of the semiconductor device 100 may be disposed on the landing pad LP in the cell area MCA. The capacitor structure may be constituted by a lower electrode 162, a capacitor dielectric layer 164, and an upper electrode 166. Lower electrodes 162 may be disposed to contact corresponding ones of the landing pads LP while extending through the etch stop layer 160, respectively, and the capacitor dielectric layer 164 may be conformally disposed along the insulating structure 155 and the lower electrodes 162. The upper electrode 166 may be disposed on the capacitor dielectric layer 164. In an embodiment, the capacitor dielectric layer 164 and the upper electrode 166 may partially cover the wiring insulating layer IL.

The semiconductor device 100 may further include a first supporter S1 connected to the lower electrode 162 while extending in a horizontal direction, and a second supporter S2 on the first supporter S1. The first supporter S1 and the second supporter S2 may prevent collapse of the lower electrode 162, and may be covered by the capacitor dielectric layer 164. The first supporter S1 and the second supporter S2 may include or may be formed of silicon nitride.

The semiconductor device 100 may further include a dummy electrode 163 supported by the first supporter S1 and the second supporter S2 while extending in a vertical direction. The dummy electrode 163 may be the lower electrode 162 nearest to the peripheral circuit area CPA from among the lower electrodes 162. In an embodiment, the dummy electrode 163 may contact an upper surface of the wiring insulating layer IL, and may be covered by the capacitor dielectric layer 164. The dummy electrode 163 may include the same material as the lower electrode 162.

The semiconductor device 100 may further include a plate layer 170 covering the upper electrode 166. The plate layer 170 may cover an upper surface and a side surface of the upper electrode 166 in the cell area MCA. In an embodiment, the plate layer 170 may partially cover the upper surface of the wiring insulating layer IL. For example, the plate layer 170 may include a first horizontal portion 170a covering the upper surface of the upper electrode 166 while extending in the horizontal direction, a vertical portion 170b covering the side surface of the upper electrode 166 while extending in the vertical direction, and a second horizontal portion 170c covering the upper surface of the wiring insulating layer IL while extending in the horizontal direction. In an embodiment, the second horizontal portion 170c may be omitted. The plate layer 170 may include a conductive material, and may be electrically connected to the upper electrode 166. For example, the plate layer 170 may include or may be formed of tungsten (W).

The upper wiring layer LU may be disposed on the wiring insulating layer IL in the peripheral circuit area CPA. The upper wiring layer LU may be disposed at a lower level than the upper surface of the capacitor structure, and, for example, an upper surface of the upper wiring layer LU may be disposed at a lower level than the upper surface of the upper electrode 166. A lower surface of the upper wiring layer LU may be disposed at the same level as lower surfaces of the vertical portion 170b and the second horizontal portion 170c of the plate layer 170. The plate layer 170 and the upper wiring layer LU may be formed by patterning a conductive layer covering the upper electrode 166 and the wiring insulating layer IL in the cell area MCA, the interface area IA and the peripheral circuit area CPA. Accordingly, the upper wiring layer LU may include the same material as the plate layer 170. Upper wiring layers LU may be disposed to be spaced apart from one another. In an embodiment, the upper wiring layers LU may have the form of lines extending in a horizontal direction or the form of islands spaced apart from one another.

The semiconductor device 100 may further include an upper insulating layer 172 covering the plate layer 170 and the upper wiring layer LU, and an upper interlayer insulating layer 174 covering the upper insulating layer 172. For example, the upper insulating layer 172 may cover the plate layer 170 in the cell area MCA, and may cover the upper wiring layer LU in the peripheral circuit area CPA. The upper interlayer insulating layer 174 may be disposed in the interface area IA and the peripheral circuit area CPA, and an upper surface of the upper interlayer insulating layer 174 may be coplanar with an upper surface of the upper insulating layer 172. The upper insulating layer 172 may include or may be formed of silicon oxynitride, and the upper interlayer insulating layer 174 may include or may be formed of silicon oxide.

The first upper contact plugs CU1 may be connected to and in contact with upper wiring layers LU while extending through the upper insulating layer 172 and the upper interlayer insulating layer 174 in the peripheral circuit area CPA. Upper surfaces of the first upper contact plugs CU1 may be coplanar with the upper surface of the upper interlayer insulating layer 174. In addition, the first upper contact plugs CU1 may be connected to and in contact with the lower wiring layers LL while extending through the wiring insulating layer IL and the etch stop layer 160. The first upper contact plugs CU1 may be electrically connected to the lower wiring layer LL and the upper wiring layer LU. The first upper contact plugs CU1 may include or may be formed of a metal such as Ti, W, Ni, Co, etc. or a metal nitride such as TiN, TiSiN, TiAlN, TaN, TaSiN, WN, etc. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The semiconductor device 100 may further include a capacitor contact plug 178 connected to the plate layer 170 while extending through the upper insulating layer 172 in the cell area MCA. The capacitor contact plug 178 may be electrically connected to the upper electrode 166 via the plate layer 170. An upper surface of the capacitor contact plug 178 may be coplanar with the upper surfaces of the upper insulating layer 172 and the upper interlayer insulating layer 174. The capacitor contact plug 178 may include the same material as the first upper contact plugs CU1.

The semiconductor device 100 may further include an insulating layer 180, contact plugs 182 and 183, and wiring patterns 184 and 185. The insulating layer 180 may be disposed on the upper insulating layer 172 and the upper interlayer insulating layer 174. The contact plugs 182 may be connected to the first upper contact plugs CU1, respectively. The wiring patterns 184 may be disposed on the insulating layer 180, and may be connected to the contact plugs 182, respectively. The contact plug 183 may be connected to the capacitor contact plug 178 in the cell area MCA. The wiring pattern 185 may be disposed on the insulating layer 180, and may be connected to the contact plug 183.

Figure 3:
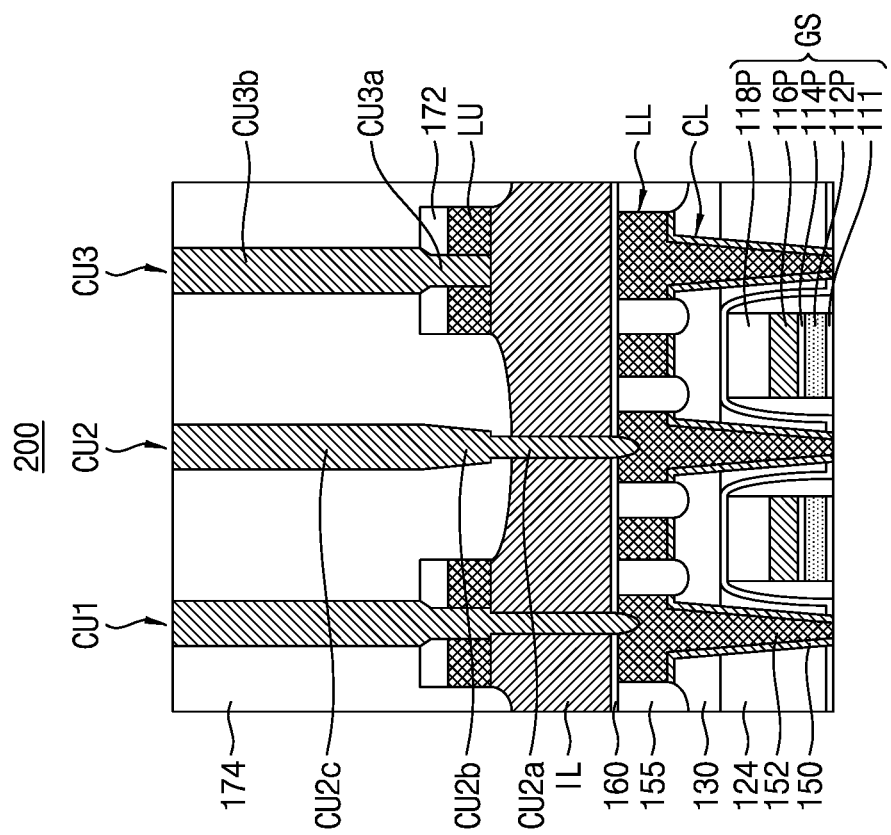
FIG. 3 is an enlarged view of the semiconductor device shown in FIG. 2.

FIG. 3 is an enlarged view of the semiconductor device shown in FIG. 2.

Referring to FIG. 3, the first upper contact plugs CU1 may include a lower portion CU1a, a middle portion CU1b, and an upper portion CU1c. For example, a portion of the first upper contact plugs CU1 lower than the upper surface of the wiring insulating layer IL may be referred to as the lower portion CU1a, a portion of the first upper contact plugs CU1 extending through the upper insulating layer 172 and the upper wiring layer LU may be referred to as the middle portion CU1*b*, and a portion of the first upper contact plugs CU1 disposed over the middle portion CU1*b* may be referred to as the upper portion CU1*c*. In an embodiment, the horizontal width of the middle portion CU1*b* may be smaller than the horizontal width of the upper portion CU1*c*, and the horizontal width of the lower portion CU1*a* may be smaller than the horizontal width of the middle portion CU1*b*. Of course, the exemplary embodiments of the disclosure are not limited to the above-described conditions, and, in an embodiment, the horizontal widths of the lower portion CU1*a*, the middle portion CU1*b* and the upper portion CU1*c* may be substantially equal. In another embodiment, the horizontal width of the middle portion CU1*b* may be greater than the horizontal width of the upper portion CU1*c*, and the horizontal width of the lower portion CU1*a* may be greater than the horizontal width of the middle portion CU1*b*. In another embodiment, a side surface of the first upper contact plugs CU1 may not have a step, and may have a tapered shape having a width gradually reduced as the first upper contact plug CU1 extends from the upper portion CU1*c* to the lower portion CU1*a*.

FIGS. 4 to 7 are vertical cross-sectional views of semiconductor devices according to example embodiments of the inventive concepts.

Figure 4:
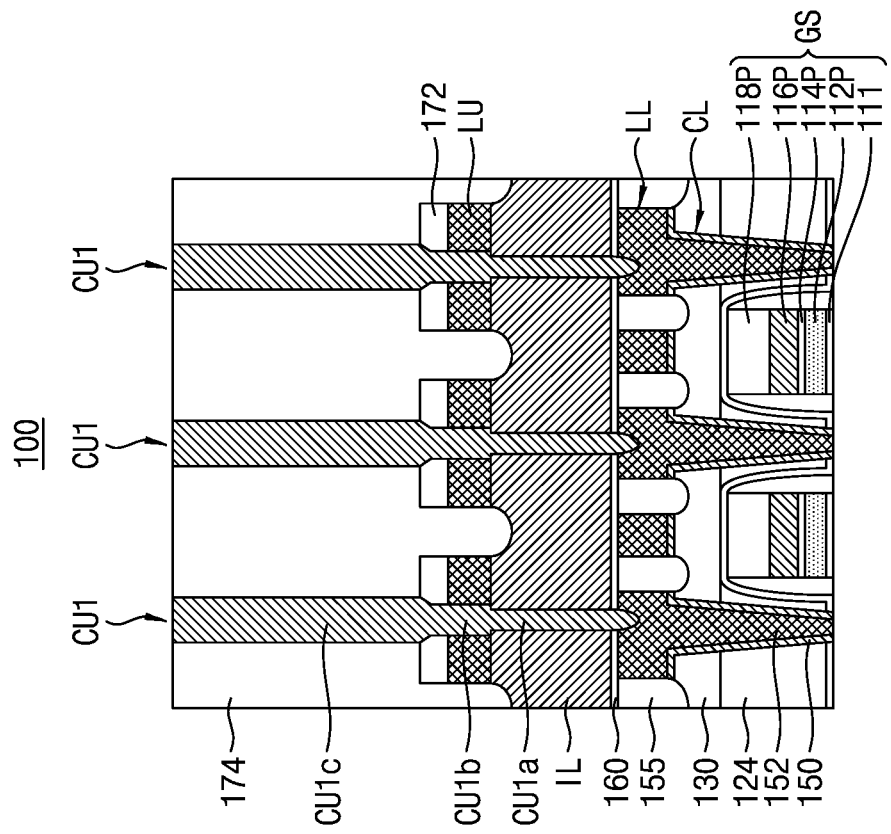
FIGS. 4 to 7 are vertical cross-sectional views of semiconductor devices according to example embodiments of the inventive concepts.

Referring to FIG. 4, a semiconductor device 200 may include, in addition to a first upper contact plug CU1, a second upper contact plug CU2 and a third upper contact plug CU3. As used herein, the singular forms "a", "an" and "the" are intended to include the plural forms as well, unless the context clearly indicates otherwise. In an embodiment, the second upper contact plug CU2 may be connected to and in contact with a lower wiring layer LL, and may not be connected to and in contact with an upper wiring layer LU. For example, the second upper contact plug CU2 may not overlap with the upper wiring layer LU in a vertical direction, and may be disposed to be spaced apart from the upper wiring layer LU in a horizontal direction. The second upper contact plug CU2 may include a lower portion CU2*a*, a middle portion CU2*b*, and an upper portion CU2*c*. The lower portion CU2*a* may completely extend through the wiring insulating layer IL, and may partially extend through the upper interlayer insulating layer 174. That is, an upper end of the lower portion CU2*a* may be disposed at a higher level than an upper surface of the wiring insulating layer IL, and a side surface of the second upper contact plug CU2 may have a step at a higher level than the upper surface of the wiring insulating layer IL.

The third upper contact plug CU3 may not be connected to and in contact with the lower wiring layer LL, and may be connected to and in contact with the upper wiring layer LU. In an embodiment, a lower surface of the third upper contact plug CU3 may be disposed at a higher level than a lower surface of the wiring insulating layer IL. For example, the lower surface of the third upper contact plug CU3 may contact the upper surface of the wiring insulating layer IL. The third upper contact plug CU3 may include a lower portion CU3*a* and an upper portion CU3*b*. The lower portion CU3*a* of the third upper contact plug CU3 may extend through the upper wiring layer LU and an upper insulating layer 172. The upper portion CU3*b* of the third upper contact plug CU3 may extend through an upper interlayer insulating layer 174. The upper wiring layer LU connected to the third upper contact plug CU3 may be connected to the first upper contact plug CU1 and, as such, may perform a wiring function. Similar to the first upper contact plug CU1, the second upper contact plug CU2 and the third upper contact plug CU3 may include or may be formed of a metal such as Ti, W, Ni, Co, etc. or a metal nitride such as TiN, TiSiN, TiAlN, TaN, TaSiN, WN, etc. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Figure 5:
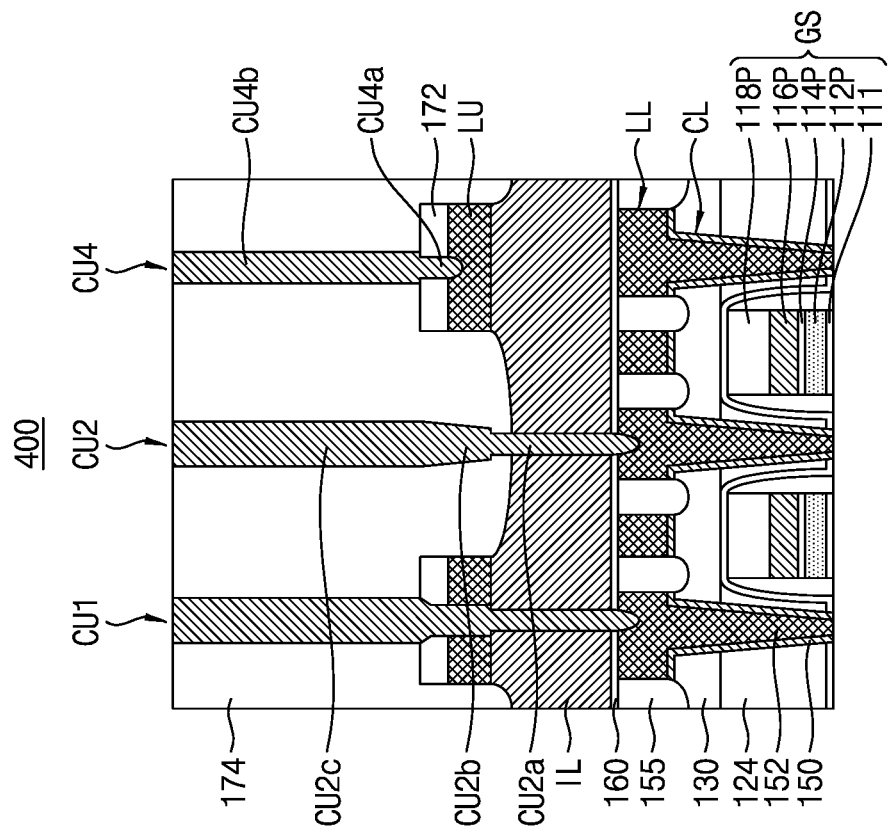

Referring to FIG. 5, a semiconductor device 300 may include a second upper contact plug CU2 connected to a lower wiring layer LL. FIG. 5 may also include a first upper contact plug CU1 and a third upper contact plug CU3. The first upper contact plug CU1 and the third upper contact plug CU3 illustrated in FIG. 5 may be similar to the first upper contact plug CU1 and the third upper contact plug CU3 illustrated in FIG. 4. As illustrated in FIG. 5, the second upper contact plug CU2 may include a lower portion CU2*a*, a middle portion CU2*b*, and an upper portion CU2*c*. In an embodiment, an upper end of the lower portion CU2*a* of the second upper contact plug CU2 may be disposed at the same level as an upper surface of a wiring insulating layer IL. For example, a side surface of the second upper contact plug CU2 may have a step at the same level as the upper surface of the wiring insulating layer IL.

Figure 6:
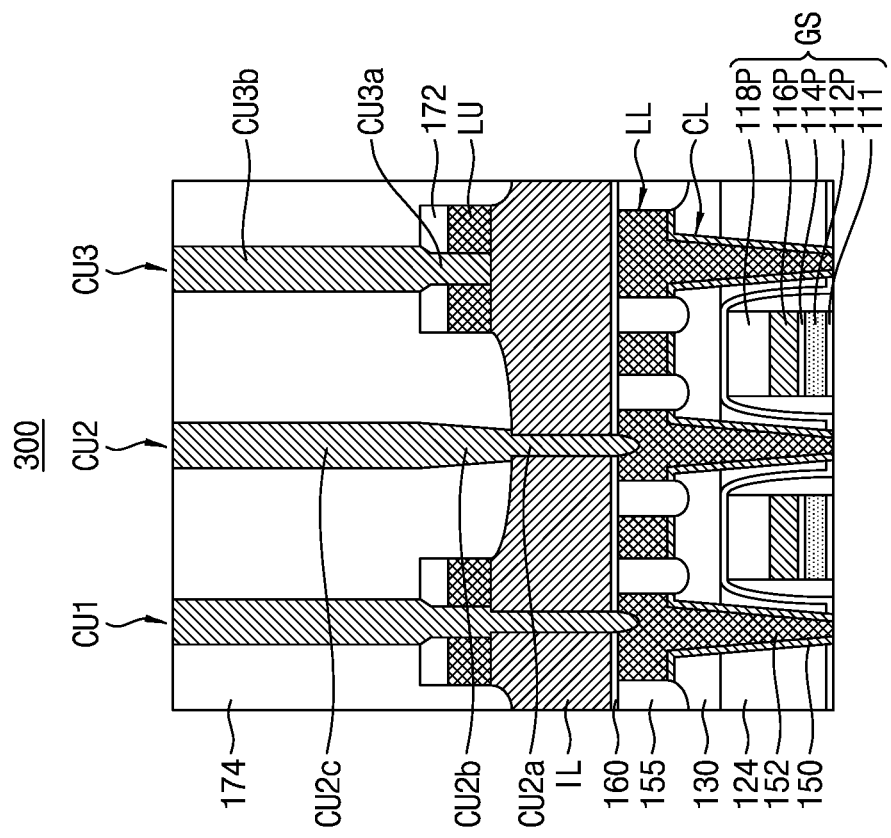

Referring to FIG. 6, a semiconductor device 400 may include a fourth upper contact plug CU3 connected to an upper wiring layer LU. FIG. 6 may also include a first upper contact plug CU1 and a second upper contact plug CU2. The first upper contact plug CU1 and the second upper contact plug CU2 illustrated in FIG. 6 may be similar to the first upper contact plug CU1 and the second upper contact plug CU2 illustrated in FIG. 4. As illustrated in FIG. 6, the horizontal width of the fourth upper contact plug CU4 may be smaller than horizontal widths of a first upper contact plug CU1 and a second upper contact plug CU2. The fourth upper contact plug CU4 may incompletely extend through the upper wiring layer LU. The fourth upper contact plug CU4 may not be connected to and in contact with the lower wiring layer LL, and may be connected to and in contact with the upper wiring layer LU. For example, a lower surface of the fourth upper contact plug CU4 may be disposed at a higher level than an upper surface of the wiring insulating layer IL. Similar to the first upper contact plug CU1, the fourth upper contact plug CU4 may include or may be formed of a metal such as Ti, W, Ni, Co, etc. or a metal nitride such as TiN, TiSiN, TiAlN, TaN, TaSiN, WN, etc.

Figure 7:
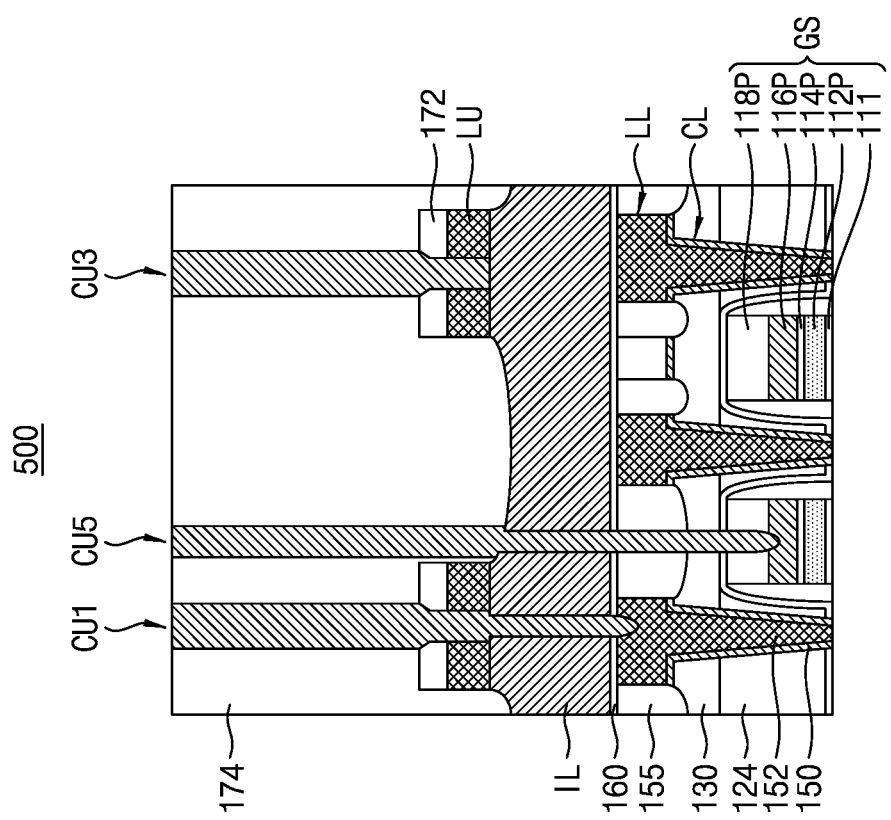

Referring to FIG. 7, a semiconductor device 500 may include a fifth upper contact plug CU5 connected to a gate structure GS. FIG. 7 may also include a first upper contact plug CU1 and a third upper contact plug CU3. The fifth upper contact plug CU5 may be connected to and in contact with a third conductive layer 116P while extending through an upper interlayer insulating layer 174, a wiring insulating layer IL, an etch stop layer 160, an insulating structure 155, a second capping layer 130, an insulating liner 122 and a first capping layer 118P. The fifth upper contact plug CU5 may be electrically insulated from a lower wiring layer LL and an upper wiring layer LU. For example, the insulating structure 155 may electrically insulate the fifth upper contact plug CU5 from the lower wiring layer LL, and the upper interlayer insulating layer 174 may electrically insulate the fifth upper contact plug CU5 from the upper wiring layer LU.

Figure 8:
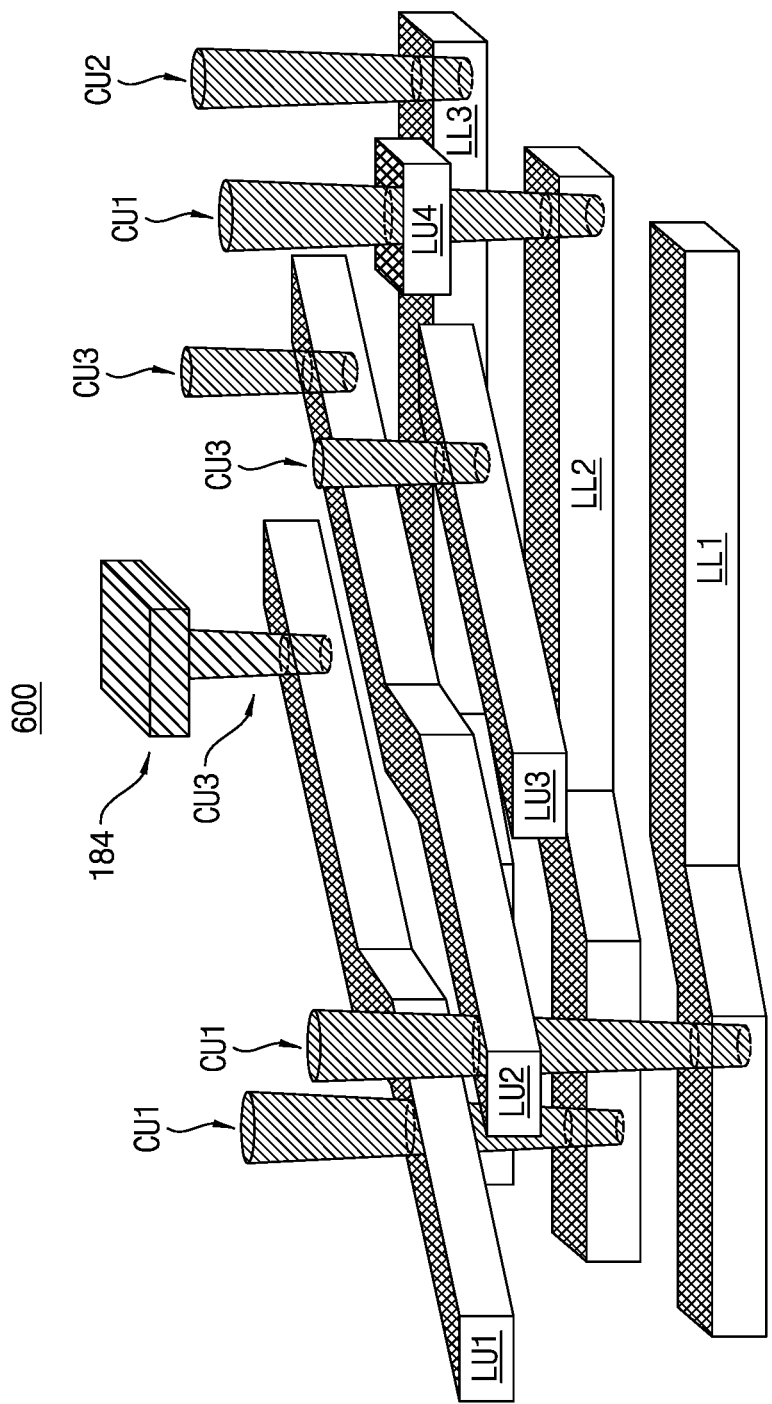
FIG. 8 is a layout of a wiring layer according to an example embodiment of the inventive concepts.

FIG. 8 is a layout of a wiring layer according to an example embodiment of the inventive concepts.

Referring to FIG. 8, a semiconductor device 600 may include upper contact plugs CU1, CU2, and CU3 shown in FIGS. 5 to 7. Although not specifically illustrated, semiconductor device 600 may also include upper contact plugs CU4 and CU5. For example, the semiconductor device 600 may include a first lower wiring layer LL1, a second lower wiring layer LL2, a third lower wiring layer LL3, a first upper wiring layer LU1, a second upper wiring layer LU2, a third upper wiring layer LU3, a fourth upper wiring layer LU4, first upper contact plugs CU1, second upper contact plugs CU2, and third upper contact plugs CU3. In an embodiment, the first lower wiring layer LL1, the second lower wiring layer LL2, and the third lower wiring layer LL3 may have the form of lines extending in a horizontal direction. The first upper contact plugs CU1, the second upper contact plugs CU2, and the third upper contact plugs CU3 may have the form of lines extending in the horizontal direction, whereas the fourth upper wiring layer LU4 may have the form of an island spaced apart from the remaining upper wiring layers LU.

The first upper wiring layer LU1 and the second lower wiring layer LL2 may be interconnected by a first upper contact plug CU1. In addition, the first upper wiring layer LU1 may be connected to a wiring pattern 184 by a third upper contact plug CU3. Accordingly, the first upper wiring layer LU1 may function as a wiring electrically interconnecting the second lower wiring layer LL2 and the wiring pattern 184. In an embodiment, a portion, higher than an upper surface of first upper wiring layer LU1, of the first upper contact plug CU1 connected to the first upper wiring layer LU1 may not function as a wiring.

The second lower wiring layer LL2 may also be connected to the fourth upper wiring layer LU4 and a first upper contact plug CU1, which interconnects the second lower wiring layer LL2 and the fourth upper wiring layer LU4. The second upper wiring layer LU2 and the first lower wiring layer LL1 may be interconnected by a first upper contact plug CU1. The second upper wiring layer LU2 may also be connected to a third upper contact plug CU3. The third upper wiring layer LU3 may be connected to a third upper contact plug CU3, and the third lower wiring layer LL3 may be connected to a second lower contact plug CL.

FIGS. 9 to 27 are plan views and vertical cross-sectional views illustrating in process order of a method of manufacturing a semiconductor device according to an example embodiment of the inventive concepts.

Figure 9:
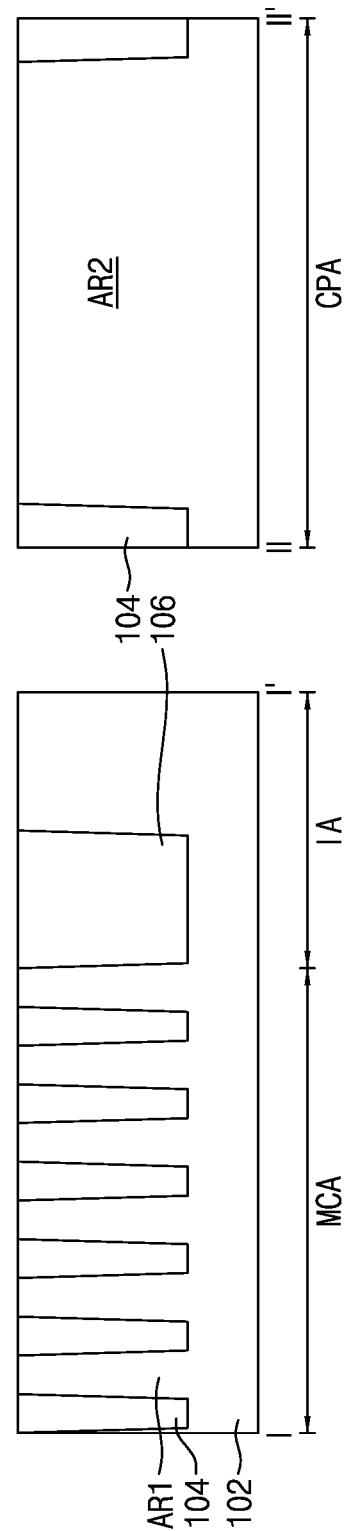
FIGS. 9 to 27 are plan views and vertical cross-sectional views illustrating in process order of a method of manufacturing a semiconductor device according to an example embodiment of the inventive concepts.

Referring to FIG. 9, an element isolation layer 104 and a region isolation layer 106 may be formed at a substrate 102. The substrate 102 may include a cell area MCA, an interface area IA, and a peripheral circuit area CPA. The interface area IA may be disposed between the cell area MCA and the peripheral circuit area CPA while surrounding the cell area MCA. The element isolation layer 104 may be disposed in the cell area MCA and the peripheral circuit area CPA, and the region isolation layer 106 may be disposed in the interface area IA.

The element isolation layer 104 and the region isolation layer 106 may be formed by forming a trench at an upper surface of the substrate 102, and filling the trench with an insulating material. First active regions AR1 may be defined by the element isolation layer 104 in the cell area MCA, and second active regions AR2 may be defined by the element isolation layer 104 in the peripheral circuit area CPA. For example, the first active regions AR1 and the second active regions AR2 may correspond to portions of the upper surface of the substrate 102 surrounded by the element isolation layer 104. When viewed in a plan view, the first active regions AR1 may have the form of bars having a shorter axis and a longer axis, and may be spaced apart from one another. The element isolation layer 104 and the region isolation layer 106 may include or may be formed of silicon oxide, silicon nitride, silicon oxynitride, or a combination thereof. The element isolation layer 104 and the region isolation layer 106 may be constituted by a single layer or multiple layers. Although the element isolation layer 104 is shown as having the same depth as the element isolation layer 106, the exemplary embodiments of the disclosure are not limited thereto. The horizontal width of the region isolation layer 106 may be greater than the horizontal width of the element isolation layer 104.

Although not shown in a cross-sectional view, gate electrodes WL may be formed to intersect the active regions in the cell area MCA. For example, the gate electrodes WL may be formed by forming, at the upper surface of the substrate 102, trenches extending in an x-direction, and forming an electrode material in the trench. The gate electrodes WL may be spaced apart from one another in a y-direction. The gate electrodes WL may include or may be formed of Ti, TiN, Ta, TaN, W, WN, TiSiN, WSiN, or a combination thereof.

In an embodiment, after formation of the gate electrodes WL, impurity ions may be implanted in portions of the first active region AR1 of the substrate 102 at opposite sides of each gate electrode WL, thereby forming a source region and a drain region. In another embodiment, an impurity ion implantation process for formation of a source region and a drain region may be performed before formation of the gate electrodes WL. In addition, an impurity ion implantation process for formation of a source region and a drain region may also be performed in the second active region AR2.

Figure 10:
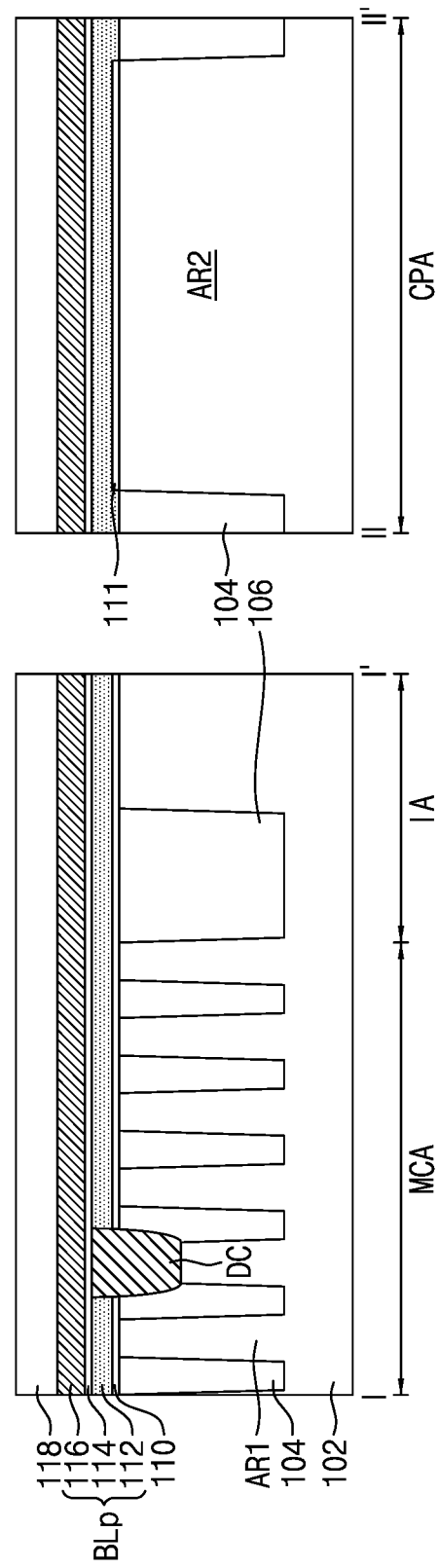

Referring to FIG. 10, a buffer layer 110, a first conductive material layer 112, a direct contact DC, a second conductive material layer 114, a third conductive material layer 116, and a first capping material layer 118 may be formed on the substrate 102 in the cell area MCA and the interface area IA. The buffer layer 110 may cover the element isolation layer 104, the region isolation layer 106, the first active regions AR1 and the second active regions AR2. The first conductive material layer 112 may cover the buffer layer 110. The buffer layer 110 may include or may be formed of silicon oxide, silicon nitride, silicon oxynitride, high-k dielectrics, or a combination thereof. The first conductive material layer 112 may include or may be formed of polysilicon.

Thereafter, a recess may be formed at the upper surface of the substrate 102 by an anisotropic etching process. The direct contact DC may be formed by filling the recess with a conductive material, and performing a planarization process. An upper surface of the direct contact DC may be coplanar with an upper surface of the first conductive material layer 112. The direct contact DC may be formed in the active region, and, for example, may contact the source region of the first active region AR1. In addition, the direct contact DC may extend through the buffer layer 110 and the first conductive material layer 112, and may fill the recess. The second conductive material layer 114, the third conductive material layer 116, and the first capping material layer 118 may be sequentially stacked on the first conductive material layer 112 and the direct contact DC. The first conductive material layer 112, the second conductive material layer 114, and the third conductive material layer 116 may constitute a bit line material layer BLp. The bit line material layer BLp may cover the cell area MCA, the interface area IA and the peripheral circuit area CPA.

The direct contact DC may include or may be formed of S1, Ge, W, WN, Co, Ni, Al, Mo, Ru, Ti, TiN, Ta, TaN, Cu, or a combination thereof. In some embodiments, the direct contact DC may include or may be formed of polysilicon. Each of the second conductive material layer 114 and the third conductive material layer 116 may include or may be formed of TiN, TiSiN, W, tungsten silicide, or a combination thereof. The first capping material layer 118 may include or may be formed of silicon nitride.

A gate dielectric layer 111 may be formed on the second active region AR2 in the peripheral circuit area CPA. In an embodiment, the gate dielectric layer 111 may be formed by performing a thermal oxidation process for an upper surface of the second active region AR2, and may include or may be formed of silicon oxide. The first conductive material layer 112 may cover the element isolation layer 104 and the gate dielectric layer 111.

Figure 11:
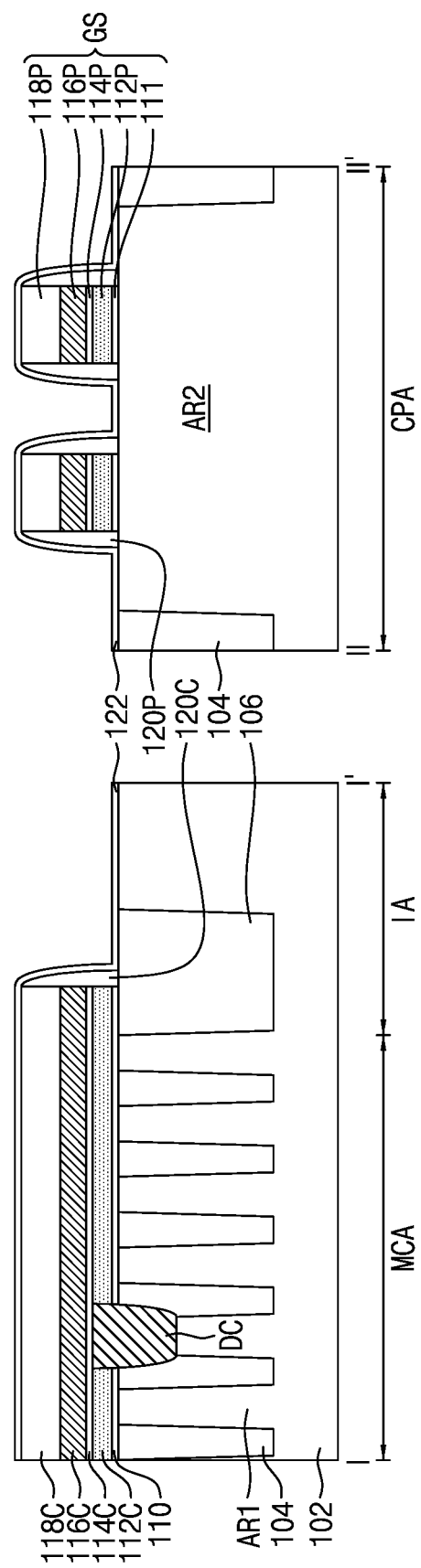

Referring to FIG. 11, the buffer layer 110, the bit line material layer BLp, and the first capping material layer 118 may be partially etched. As the first conductive material layer 112, the second conductive material layer 114, the third conductive material layer 116, and the first capping material layer 118 are etched, a first conductive layer 112C, a second conductive layer 114C, a third conductive layer 116C, and a first capping layer 118C may be formed, respectively. For example, the bit line material layer BLp may be partially etched, and an end surface of the bit line material layer BLp may be disposed on the region isolation layer 106 in the interface area IA.

In the peripheral circuit area CPA, the gate dielectric layer 111, the bit line material layer BLp, and the first capping material layer 118 may be etched, thereby forming a gate structure GS. As the first conductive material layer 112, the second conductive material layer 114, the third conductive material layer 116, and the first capping material layer 118 are etched, a first conductive layer 112P, a second conductive layer 114P, a third conductive layer 116P, and a first capping layer 118P may be formed, respectively. The buffer layer 110, the first conductive layer 112P, the second conductive layer 114P, the third conductive layer 116P, and the first capping layer 118P may form a gate structure GS. The gate structure GS may be disposed adjacent to a source/drain region in the second active region AR2. For example, source/drain regions may be disposed at opposite sides of the gate structure GS.

After etching of the bit line material layer BLp, an edge spacer 120C and a gate spacer 120P may be formed. For example, the edge spacer 120C and the gate spacer 120P may be formed by depositing an insulating material such that the insulating material covers the substrate 102, the element isolation layer 104, the region isolation layer 106 and the etched bit line material layer BLp, and then etching the insulating material by an anisotropic etching process. The edge spacer 102C may be disposed in the interface area IA, and may cover side surfaces of the buffer layer 110, the first conductive layer 112C, the second conductive layer 114C, the third conductive layer 116C and the first capping layer 118C. The gate spacer 120P may be disposed in the peripheral circuit area CPA, and may cover side surfaces of the buffer layer 110, the first conductive layer 112P, the second conductive layer 114P, the third conductive layer 116P and the first capping layer 118P.

The edge spacer 120C and the gate spacer 120P may include or may be formed of silicon oxide, silicon nitride, silicon oxynitride, or a combination thereof. In an embodiment, the edge spacer 120C and the gate spacer 120P may include or may be formed of silicon oxide.

Subsequently, an insulating material may be deposited, thereby forming an insulating liner 122. The insulating liner 122 may be conformally formed on the cell area MCA, the interface area IA and the peripheral circuit area CPA. For example, the insulating liner 122 may cover the substrate 102, the first capping layer 118C, the edge spacer 120C, the gate structure GS and the gate spacer 120P. In an embodiment, the insulating liner 122 may include or may be formed of silicon nitride.

Figure 12:
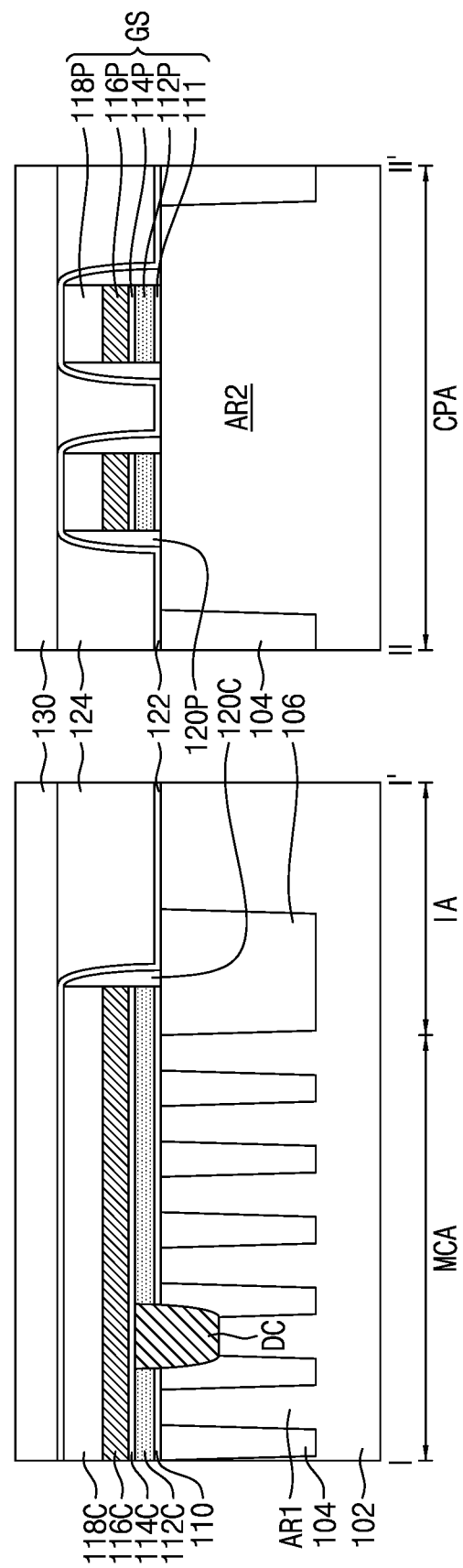

Referring to FIG. 12, a lower interlayer insulating layer 124 and a second capping layer 130 may be formed. The lower interlayer insulating layer 124 may be formed by depositing an insulating material on the insulating liner 122, and then performing a planarization process such that an upper surface of the insulating liner 122 is exposed. Although an upper surface of the lower interlayer insulating layer 124 may be coplanar with the upper surface of the insulating liner 122, the exemplary embodiments of the disclosure are not limited thereto. In an embodiment, a portion of the insulating liner 122 on the first capping layer 118C may be removed by the planarization process, and the upper surface of the lower interlayer insulating layer 124 may be coplanar with an upper surface of the first capping layer 118C. The lower interlayer insulating layer 124 may include or may be formed of silicon oxide.

The second capping layer 130 may be formed on the insulating liner 122 and the lower interlayer insulating layer 124. The second capping layer 130 may include or may be formed of silicon oxide, silicon nitride, silicon oxynitride, or a combination thereof. In an embodiment, the second capping layer 130 may include or may be formed of silicon nitride.

Figure 13:
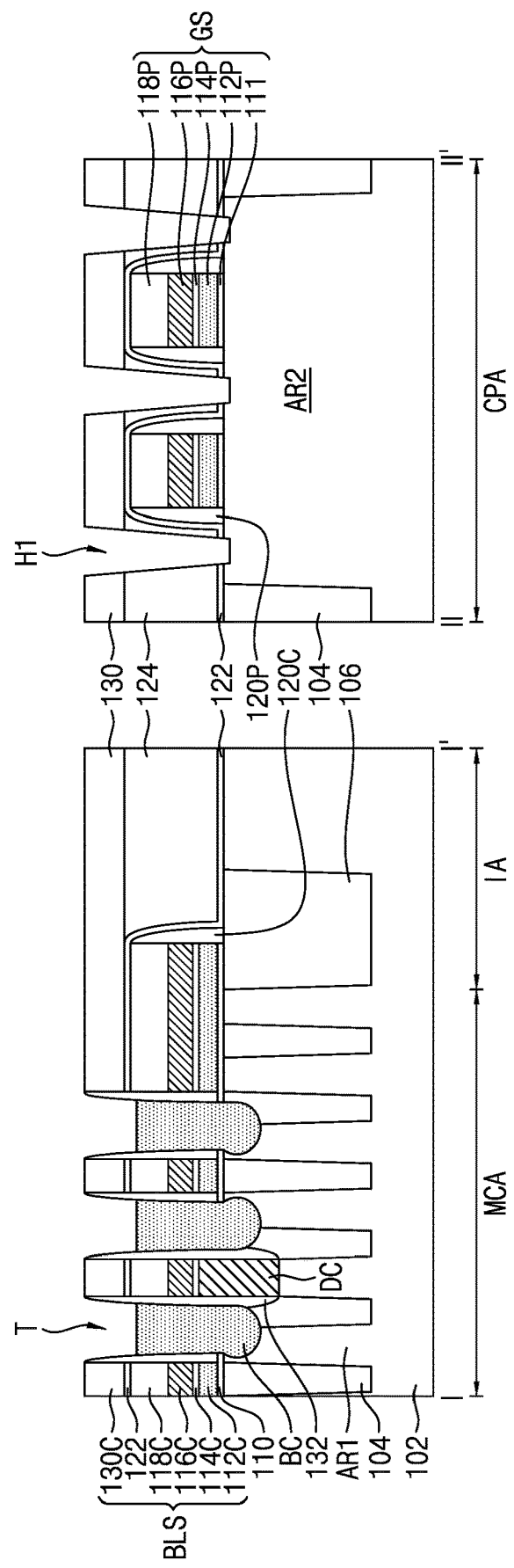

Referring to FIG. 13, the buffer layer 110, the first conductive layer 112C, the second conductive layer 114C, the third conductive layer 116C, the first capping layer 118C, and the second capping layer 130 may be etched to form a trench T extending in the y-direction, thereby forming a bit line structure BLS. The first conductive layer 112C, the second conductive layer 114C, the third conductive layer 116C, the first capping layer 118C, the insulating liner 122, and a second capping layer 130C may constitute the bit line structure BLS. The bit line structure BLS may have the form of a bar extending in the y-direction.

After formation of the bit line structure BLS, insulating spacers 132 may be formed at side surfaces of the bit line structure BLS. The insulating spacers 132 may be formed by depositing an insulating material covering the bit line structure BLS and an inner wall of the trench T, and then anisotropically etching the insulating material. The insulating spacers 132 may cover the side surfaces of the bit line structure BLS, and may also cover side surfaces of the direct contact BC. The insulating spacers 132 may be constituted by a single layer or multiple layers, and may include or may be formed of silicon oxide, silicon nitride, silicon oxynitride, or a combination thereof.

After formation of the insulating spacers 132, buried contacts BC may be formed at the side surfaces of the bit line structure BLS. The buried contacts BC may be formed by forming a sacrificial layer (not shown) extending in the y-direction while filling the trench T at the side surfaces of the bit line structure BLS, forming fence insulating layers (not shown) at portions of the sacrificial layer overlapping with the gate electrodes WL in a vertical direction, removing the sacrificial layer, and then depositing a conductive material at opposite sides of the bit line structure BLS.

After formation of the buried contact BC, an etch-back process for etching an upper portion of the buried contact BC may further be performed. For example, an upper surface of the buried contact BC may be disposed at a lower level than an upper surface of the bit line structure BLS. The buried contact BC may extend into the substrate 102. For example, a lower end of the buried contact BC may be disposed at a lower level than the upper surface of the substrate 102, and may contact the drain region of the first active region AR1. The insulating spacer 132 may be disposed between the buried contact BC and the bit line structure BLS and, as such, may electrically insulate the buried contact BC and the bit line structure BLS from each other. The buried contact BC may include or may be formed of polysilicon.

A first contact hole H1 exposing the second active region AR2 may be formed in the peripheral circuit are CPA. The first contact hole H1 may be formed by anisotropically etching the lower interlayer insulating layer 124 and the second capping layer 130, and may be formed adjacent to the gate structure GS.

Figure 14:
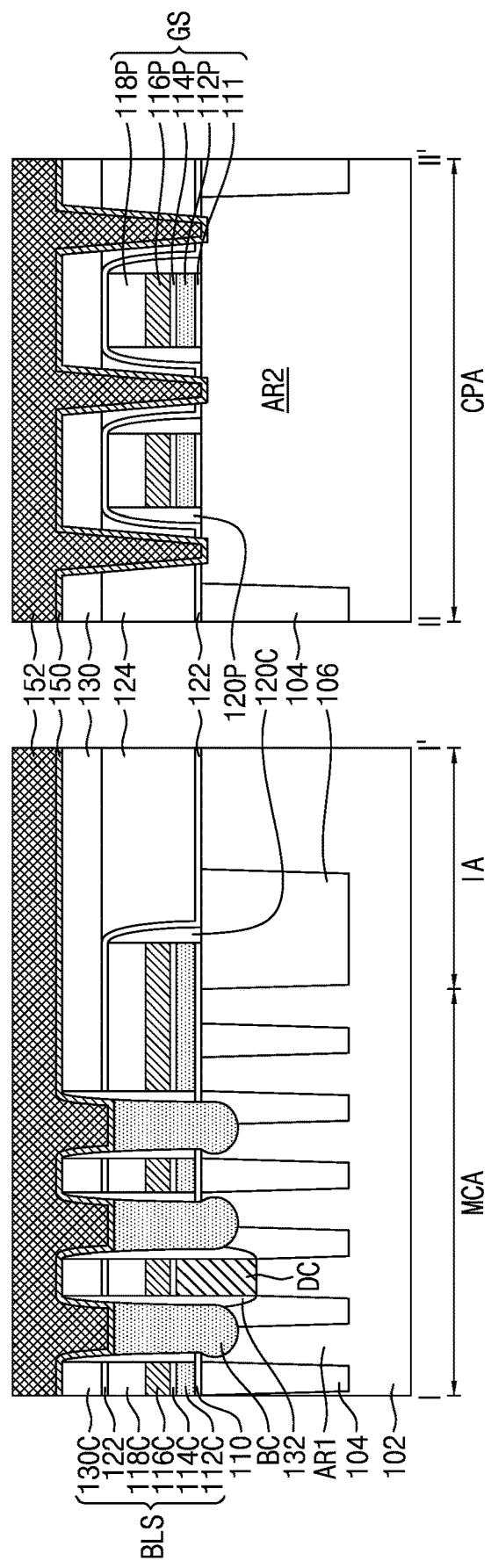

Referring to FIG. 14, a barrier layer 150 and a conductive layer 152 may be formed. The barrier layer 150 may be conformally formed on the resultant structure of FIG. 13. For example, the barrier layer 150 may be formed along the bit line structure BLS, the trench T, the second capping layer 130, and the first contact hole H1. The conductive layer 152 may be deposited on the barrier layer 150. In an embodiment, before formation of the barrier layer 150, a process for forming a metal silicide layer on the buried contact BC may be further performed.

The barrier layer 150 may include or may be formed of a metal silicide such as cobalt silicide, nickel silicide and manganese silicide. The conductive layer 152 may include or may be formed of polysilicon, metal, metal silicide, conductive metal nitride, or a combination thereof. In an embodiment the conductive layer 152 may include or may be formed of tungsten.

Figure 15:
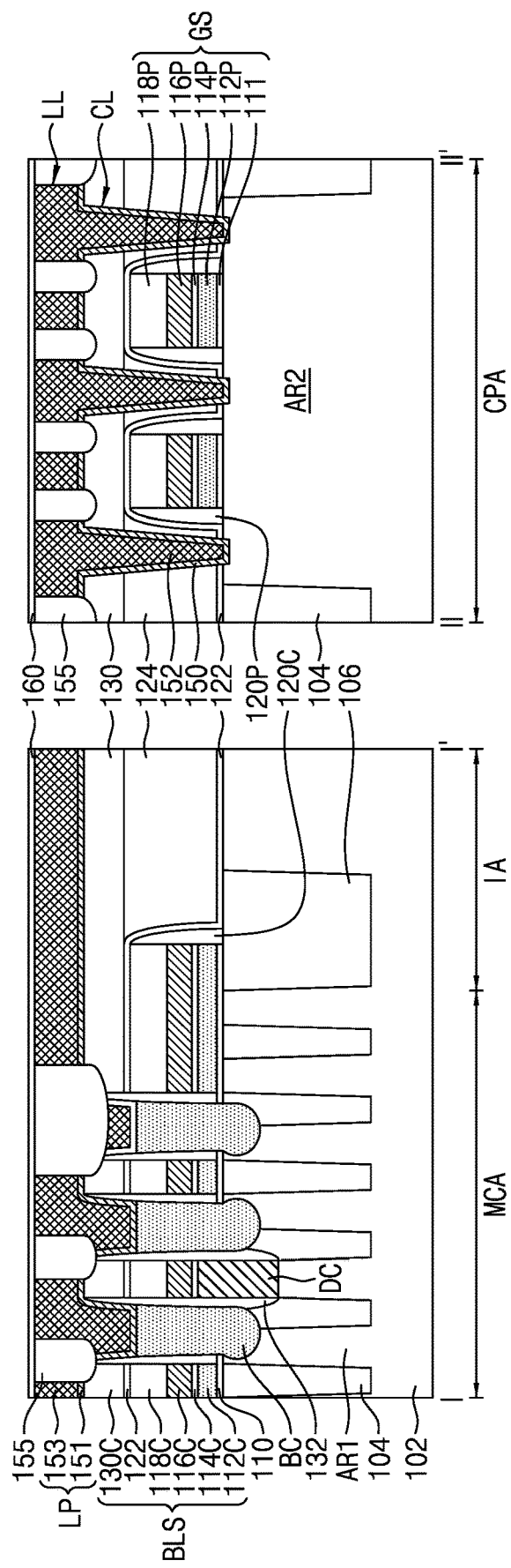

Referring to FIG. 15, a landing pad LP, an insulating structure 155, a lower contact plug CL, a lower wiring layer LL, and an etch stop layer 160 may be formed. A barrier pattern 151 and a conductive pattern 153 may be formed by patterning the barrier layer 150 and the conductive layer 152 of FIG. 14 in the cell area MCA, and may constitute the landing pad LP. The landing pad LP may be electrically connected to the first active region AR1 via the buried contact BC.

The insulating structure 155 may be formed by etching the barrier layer 150 and the conductive layer 152 of FIG. 14, and then filling etched portions of the barrier layer 150 and the conductive layer 152 with an insulating material. The insulating structure 155 may be disposed between adjacent ones of landing pads LP and, as such, may electrically insulate the landing pads LP from each other. An upper surface of the insulating structure 155 may be coplanar with an upper surface of the landing pad LP. The insulating structure 155 may include or may be formed of silicon oxide, silicon nitride, silicon oxynitride, or a combination thereof.

The insulating structure 155 may also be disposed in the peripheral circuit area CPA. For example, as the insulating structure 155 is formed in the peripheral circuit area CPA, a lower contact plug CL and a lower wiring layer LL defined by the insulating structure 155 may be formed. The lower contact plug CL may contact the second active region AR2 while filling the first contact hole H1. The lower contact plug CL may include a conductive layer 152, and a barrier layer 150 covering a lower surface and a side surface of the conductive layer 152. The lower wiring layer LL may be disposed at an upper surface of the lower contact plug CL, and may include a conductive layer 152, and a barrier layer 150 covering a lower surface of the conductive layer 152. The lower wiring layer LL may be materially in continuity with the lower contact plug CL. For example, the conductive layer 152 of the lower wiring layer LL and the conductive layer 152 of the lower contact plug CL may be materially in continuity with each other, and the barrier layer 150 of the lower wiring layer LL and the barrier layer 150 of the lower contact plug CL may be materially in continuity with each other. The upper surface of the lower wiring layer LL may be disposed at the same level as the upper surfaces of the landing pad LP and the insulating structure 155. Adjacent ones of lower wiring layers LL may be electrically insulated from each other by the insulating structure 155. In an embodiment, the lower wiring layers LL may have the form of lines extending in a horizontal direction or the form of islands spaced apart from one another.

The etch stop layer 160 may be formed to extend along all of the cell area MCA, the interface area IA and the peripheral circuit area CPA, and may cover the upper surfaces of the land pad LP, the insulating structure 155 and the lower wiring layer LL. In an embodiment, the etch stop layer 160 may include or may be formed of SiBN.

Figure 16:
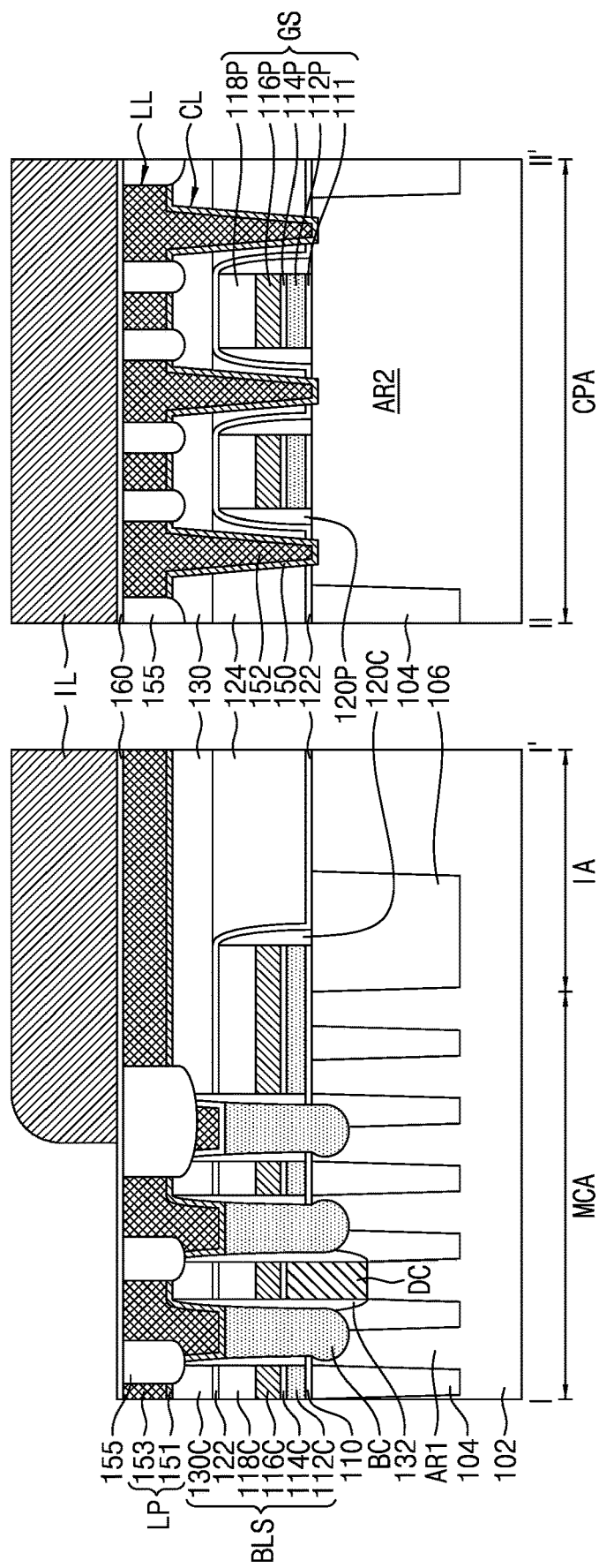

Referring to FIG. 16, a wiring insulating layer IL may be formed at an upper surface of the etch stop layer 160. The wiring insulating layer IL may be formed by depositing an insulating material covering the etch stop layer 160, and etching the insulating material such that a portion of the etch stop layer 160 corresponding to the landing pad LP in the cell area MCA is exposed (i.e., not covered by the wiring insulating layer IL). For example, the wiring insulating layer IL may be disposed in the interface area IA and the peripheral circuit area CPA. In an embodiment, the wiring insulating layer IL may also be disposed in the cell area MCA. The wiring insulating layer IL may include a material having etch selectivity with respect to the etch stop layer 160. In an embodiment, the wiring insulating layer IL may include or may be formed of silicon nitride.

Figure 17:
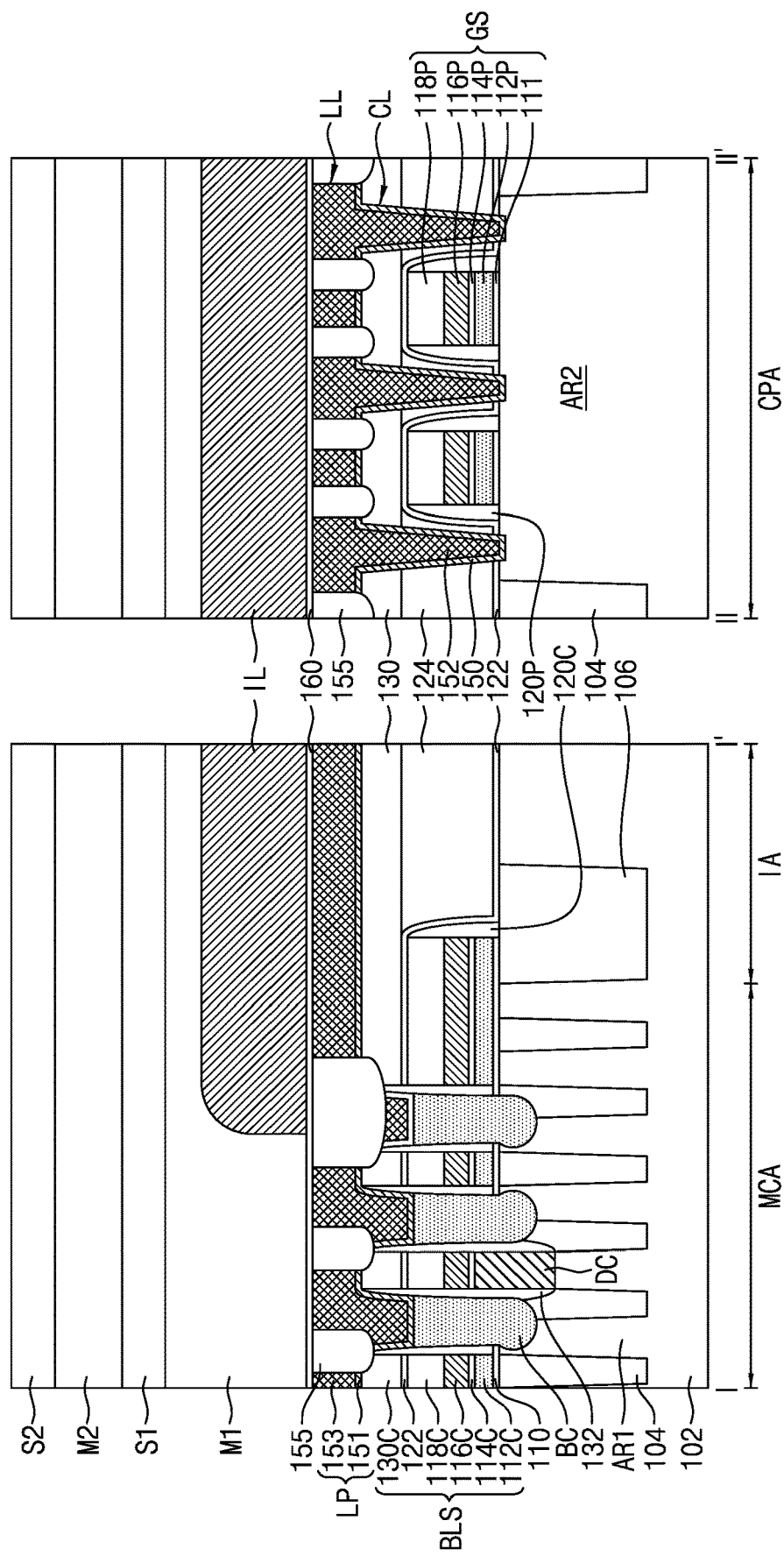

Referring to FIG. 17, a first mold layer M1, a first supporter S1, a second mold layer M2, and a second supporter S2 may be formed in the cell area MCA, the interface area IA and the peripheral circuit area CPA. The first mold layer M1 may be formed by depositing an insulating material covering the etch stop layer 160 and the wiring insulating layer IL, and then planarizing the insulating material. The first mold layer M1 and the second mold layer M2 may include a material having etch selectivity with respect to the first supporter S1 and the second supporter S2. In an embodiment, the first mold layer M1 and the second mold layer M2 may include or may be formed of silicon oxide, and the first supporter S1 and the second supporter S2 may include or may be formed of silicon nitride.

Figure 18:
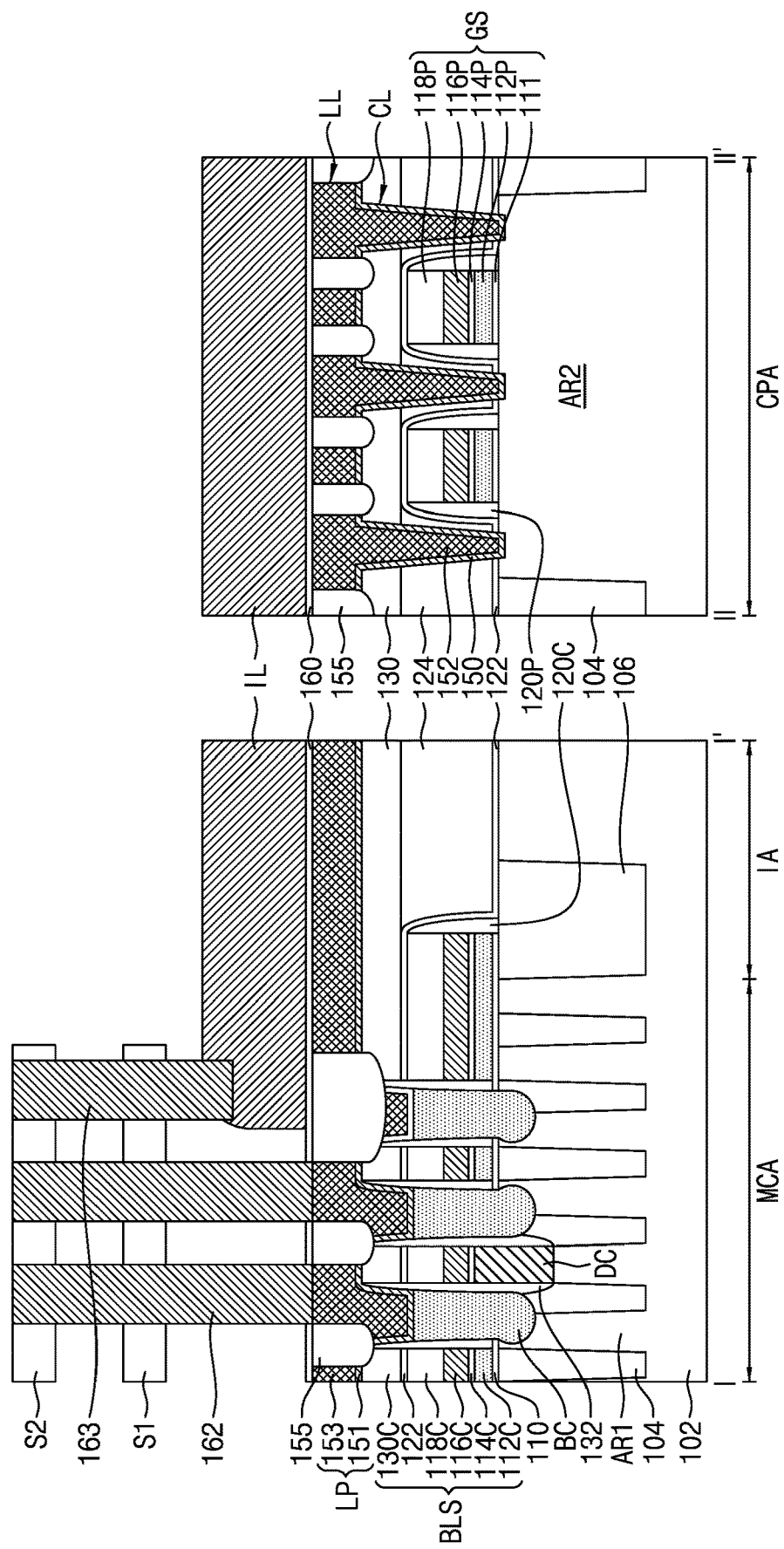

Referring to FIG. 18, a lower electrode 162 contacting the landing pad LP may be formed. The lower electrode 162 may be formed by forming a through hole vertically extending through the first mold layer M1, the first supporter S1, the second mold layer M2 and the second supporter S2, and then filling the through hole with a conductive material. Upon formation of the through hole, the etch stop layer 160 may be removed and, as such, the landing pad LP may be exposed. The lower electrode 162 may be electrically connected to the buried contact BC via the landing pad LP.

In an embodiment, formation of the lower electrode 162 may include forming a dummy electrode 163. The dummy electrode 163 may be defined by an outermost one of lower electrodes 162. For example, the dummy electrode 163 may be the lower electrode 162 nearest to the peripheral circuit area CPA from among the lower electrodes 162. In an embodiment, the dummy electrode 163 may contact the upper surface of the wiring insulating layer IL. For example, the dummy electrode 163 may partially extend through the wiring insulating layer IL, and a lower surface of the dummy electrode 163 may be disposed at a higher level than a lower surface of the lower electrode 162. Although only one dummy electrode 163 is shown in FIG. 18, the exemplary embodiments of the disclosure are not limited thereto. In an embodiment, a plurality of dummy electrodes 163 may be formed.

In an embodiment, the lower electrode 162 and the dummy electrode 163 may have a pillar shape, without being limited thereto. In another embodiment, the lower electrode 162 and the dummy electrode 163 may have a cylindrical shape or a hybrid shape of a pillar shape and a cylindrical shape. The lower electrode 162 may include or may be formed of a metal such as Ti, W, Ni, Co, etc. or a metal nitride such as TiN, TiSiN, TiAlN, TaN, TaSiN, WN, etc. In an embodiment, the lower electrode 162 may include or may be formed of TiN.

Thereafter, the first supporter S1 and the second supporter S2 may be patterned. For example, a supporter hole (not shown) may be formed through the first supporter S1 and the second supporter S2, and portions of the first supporter S1 and the second supporter S2 in the interface area IA and the peripheral circuit area CPA may be removed. After patterning of the first supporter S1 and the second supporter S2, the first mold layer M1 and the second mold layer M2 may be removed. The first mold layer M1 and the second mold layer M2 may be removed by a wet etching process, and the first supporter S1 and the second supporter S2, which have etch selectivity with respect to the first mold layer M1 and the second mold layer M2, may not be removed. The first supporter S1 and the second supporter S2 not removed may prevent collapse of the lower electrode 162.

Figure 19:
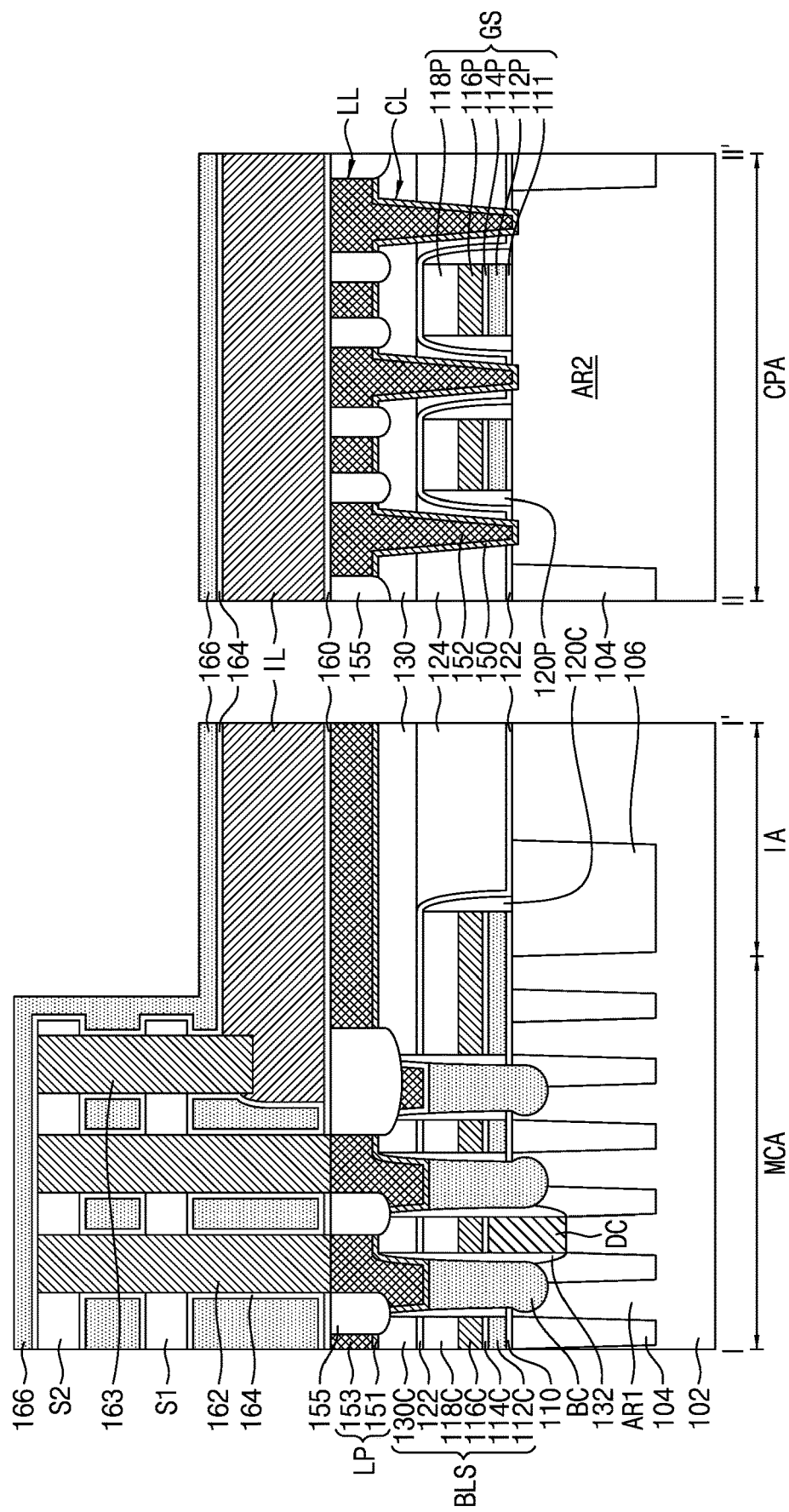

Referring to FIG. 19, a capacitor dielectric layer 164 and an upper electrode 166 may be formed. The capacitor dielectric layer 164 may be conformally formed on the resultant structure of FIG. 18. For example, the capacitor dielectric layer 164 may cover the etch stop layer 160, the first supporter S1, the second supporter S2, the wiring insulating layer IL, the lower electrode 162 and the dummy electrode 163. The capacitor dielectric layer 164 may include or may be formed of a metal oxide such as $HfO_2$, $ZrO_2$, $Al_2O_3$, $La_2O_3$, $Ta_2O_3$, and $TiO_2$, a dielectric material having a perovskite structure such as $SrTiO_3$(STO), $BaTiO_3$, PZT and PLZT, or a combination thereof.

The upper electrode 166 may be formed on the capacitor dielectric layer 164. For example, the upper electrode 166 may fill a space among the lower electrodes 162. In addition, the upper electrode 166 may also be formed in the interface area IA and the peripheral circuit area CPA. The lower electrode 162, the capacitor dielectric layer 164 and the upper electrode 166 may constitute a capacitor structure of a semiconductor device. In an embodiment, the upper electrode 166 may include a silicon layer. For example, the upper electrode 166 may include a conductive material, and SiGe covering the conductive material. The conductive material may include or may be formed of, for example, a metal such as Ti, W, Ni, Co, etc. or a metal nitride such as TiN, TiSiN, TiAlN, TaN, TaSiN, WN, etc.

Figure 20:
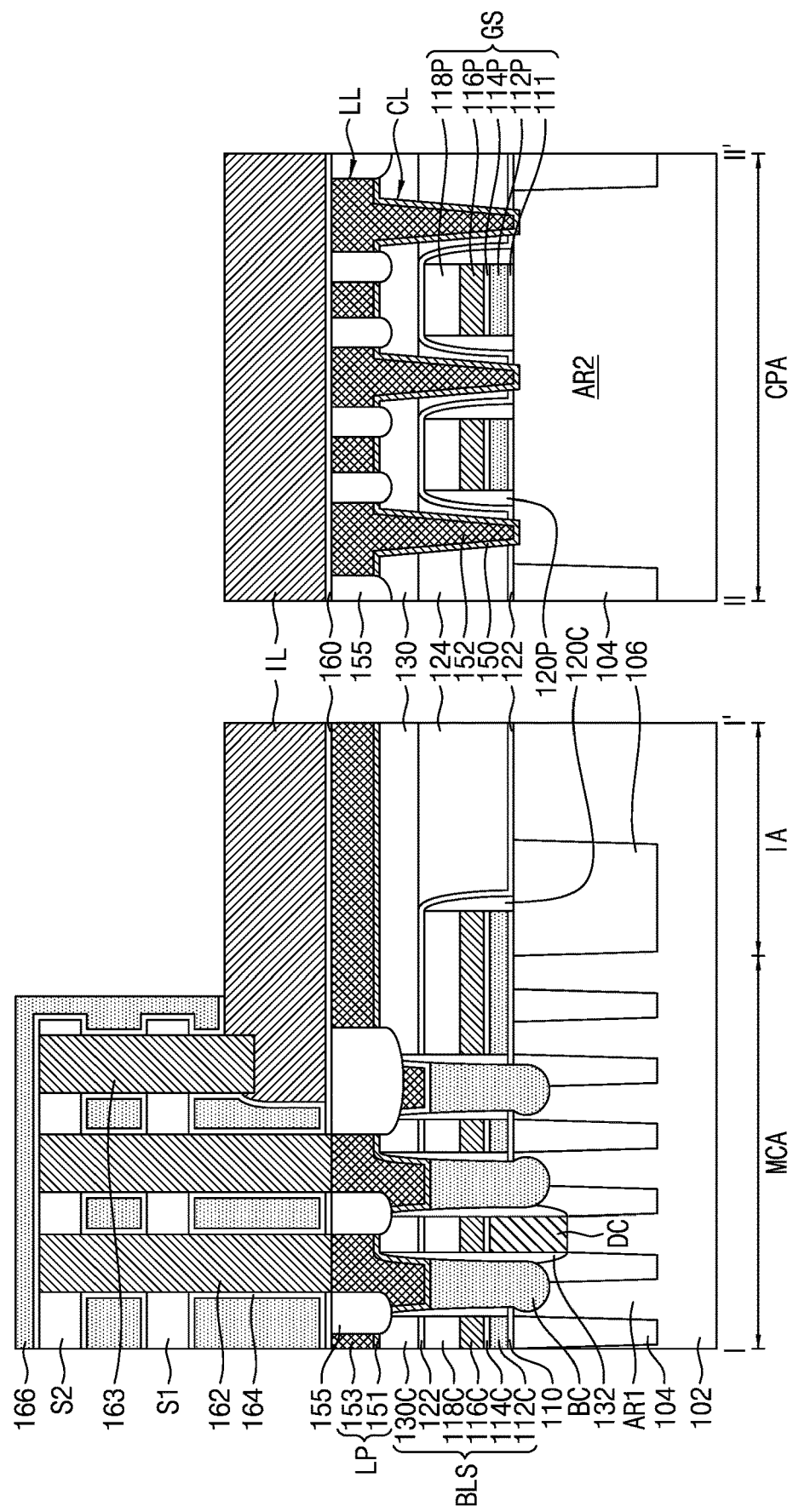

Referring to FIG. 20, the capacitor dielectric layer 164 and the upper electrode 166 may be partially etched. For example, portions of the capacitor dielectric layer 164 and the upper electrode 166 covering the interface area IA and the peripheral circuit area CPA may be removed. In an embodiment, the capacitor dielectric layer 164 may not be removed.

Figure 21:
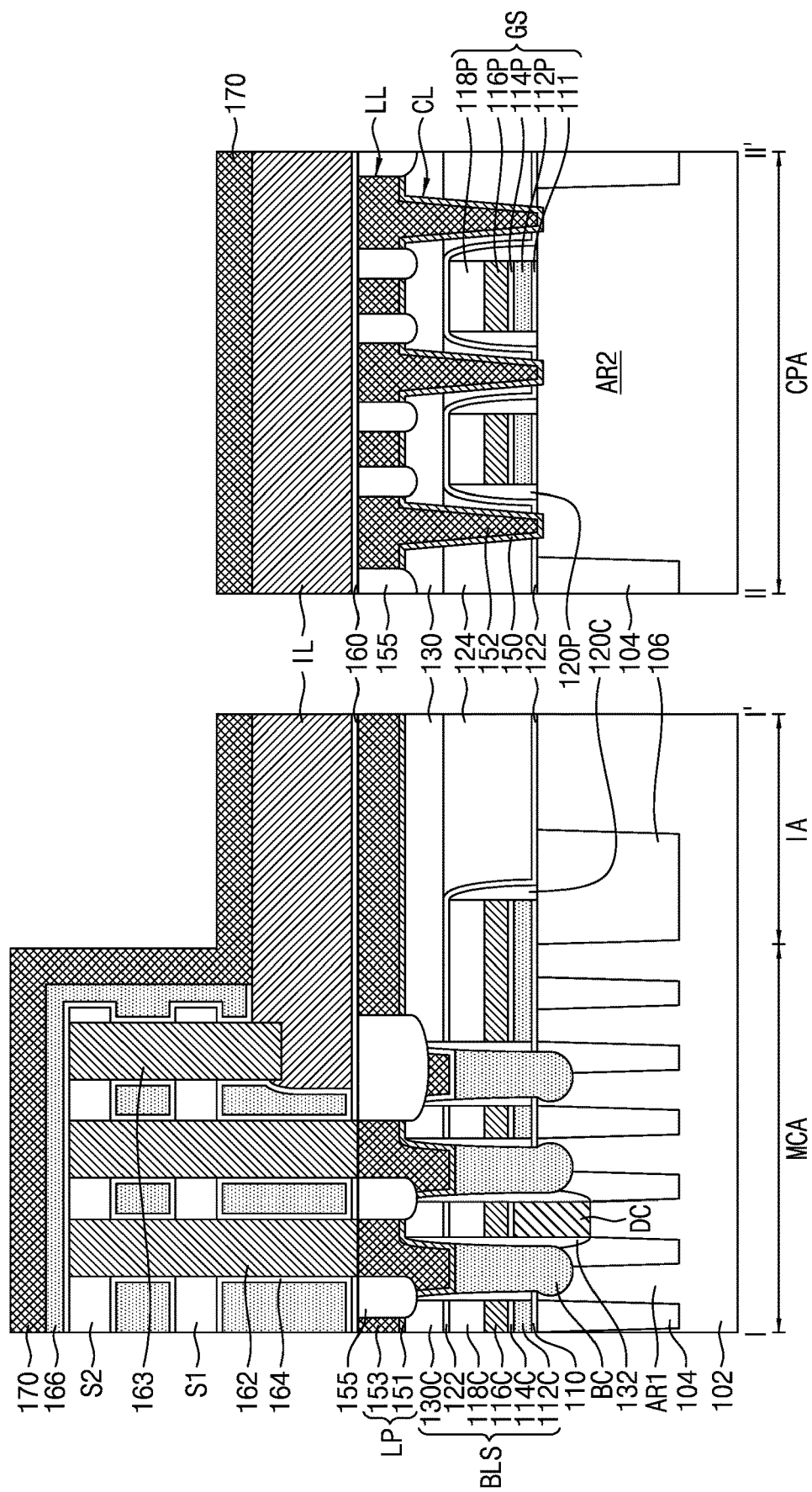

Referring to FIG. 21, a plate layer 170 may be formed on the wiring insulating layer IL and the upper electrode 166. The plate layer 170 may cover the upper electrode 166 in the cell area MCA while covering the wiring insulating layer IL in the interface area IA and the peripheral circuit area CPA. The plate layer 170 may be formed by a physical vapor deposition (PVD) process. Upon formation of the plate layer 170, a barrier material formation process may be omitted and, as such, the plate layer 170 may contact the upper electrode 166 and the wiring insulating layer IL. In an embodiment, the plate layer 170 may include or may be formed of metal such as Ti, W, Ni, Co, Ru, etc., without being limited thereto.

Figure 22:
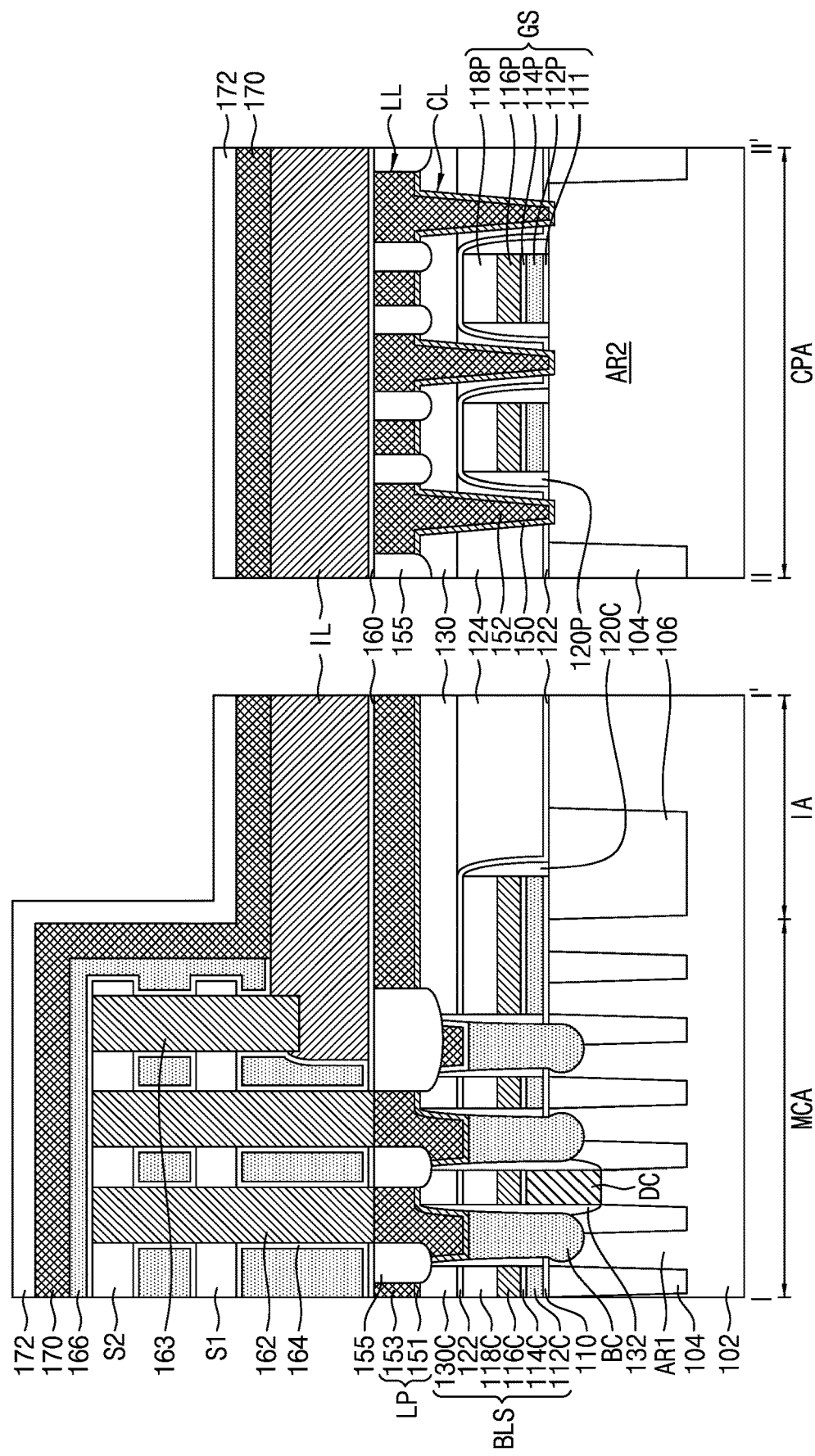

Referring to FIG. 22, an upper insulating layer 172 may be formed on the plate layer 170. The upper insulating layer 172 may cover the plate layer 170 in the cell area MCA, the interface area IA and the peripheral circuit area CPA. The upper insulating layer 172 may include or may be formed of silicon oxide, silicon nitride, silicon oxynitride, or a combination thereof. In an embodiment, the upper insulating layer 172 may include or may be formed of silicon oxynitride.

Figure 23:
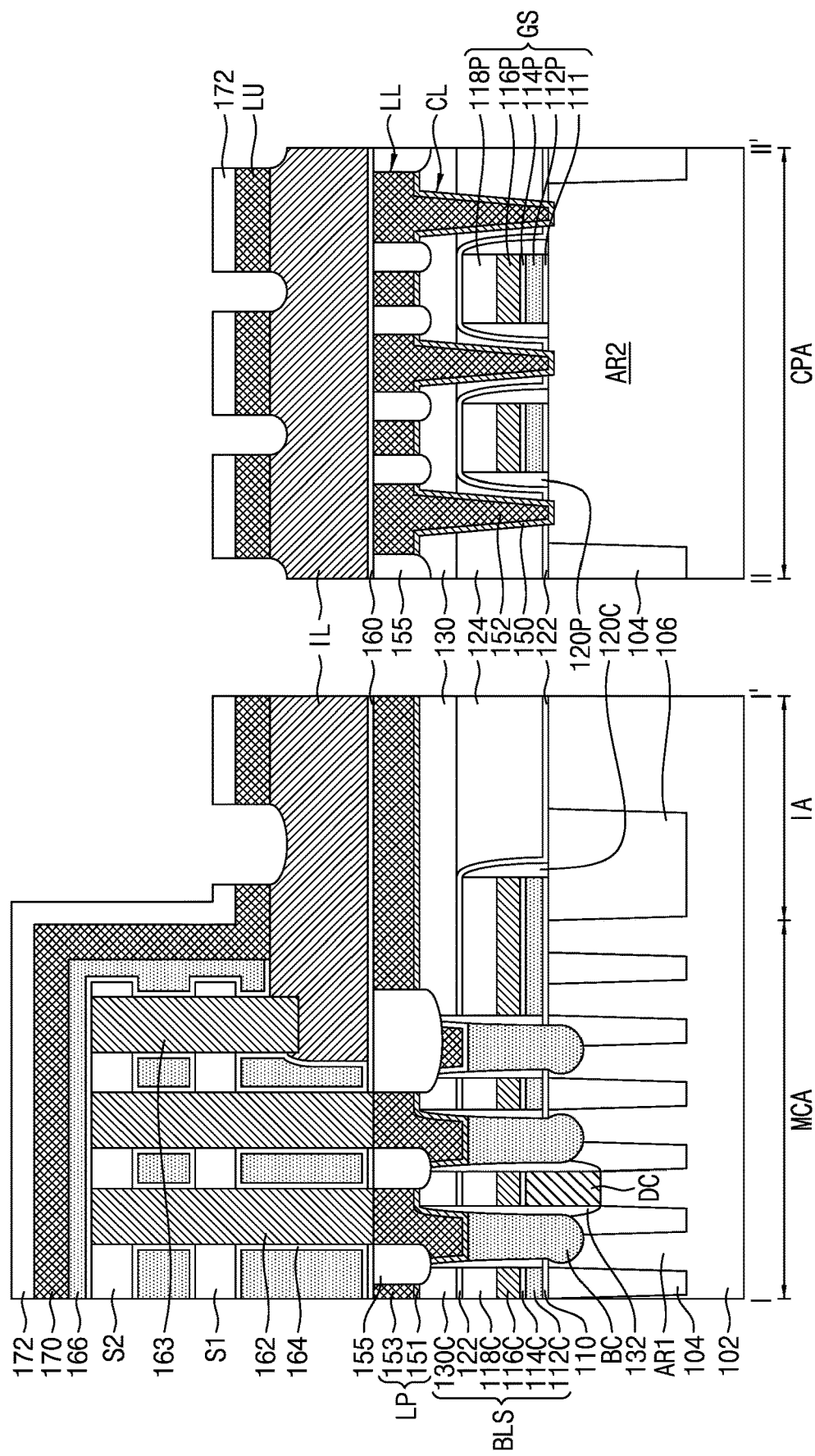

Referring to FIG. 23, the plate layer 170 and the upper insulating layer 172 may be patterned. For example, a portion of the plate layer 170 cover the upper electrode 166 and a portion of the plate layer 170 extending on the wiring insulating layer IL in a horizontal direction may be separated from each other. The patterning process may include forming a hard mask, such as a spin-on hardmask (SOH), covering the upper insulating layer 172, patterning the hard mask using a photoresist, and performing anisotropic etching using the patterned hard mask as an etch mask. The patterned plate layer 170 on the wiring insulating layer IL may be referred to as an upper wiring layer LU. Upper wirings may be electrically insulated from the plate layer 170 covering the upper electrode 166. The upper wirings may have the form of bars extending in a horizontal direction or the form of islands spaced apart from one another. In the patterning process, the wiring insulating layer IL may be partially etched and, as such, a recess may be formed at the upper surface of the wiring insulating layer IL. For example, the recess may be formed among upper wiring layers LU.

As shown in FIG. 23, the upper wiring layer LU may be formed by patterning the plate layer 170, and may function as a wiring. Since the upper wiring layer LU functions as a wiring, freedom of design may be increased, and the size of the peripheral circuit area CPA may be reduced.

Figure 24:
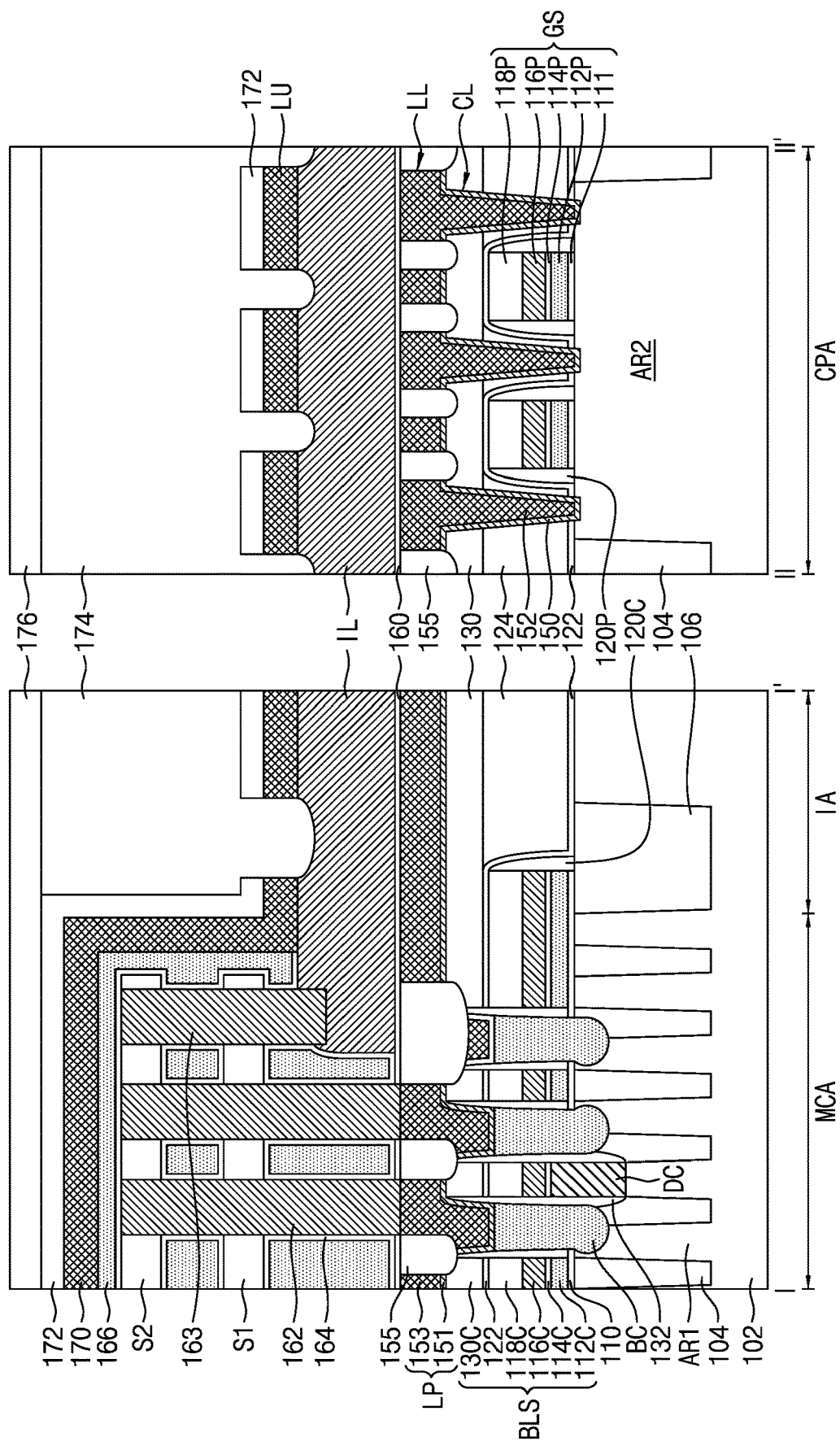

Referring to FIG. 24, an upper interlayer insulating layer 174 and an insulating layer 176 may be formed. The upper interlayer insulating layer 174 may be formed by depositing an insulating material covering the upper insulating layer 172, and then planarizing the insulating material such that an upper surface of the upper insulating layer 172 is exposed. The upper interlayer insulating layer 174 may cover the upper insulating layer 172 in the interface area IA and the peripheral circuit area CPA. The insulating layer 176 may cover the upper insulating layer 172 and the upper interlayer insulating layer 174. The upper interlayer insulating layer 174 and the insulating layer 172 may include or may be formed of silicon oxide, silicon nitride, silicon oxynitride, or a combination thereof.

Figure 25:
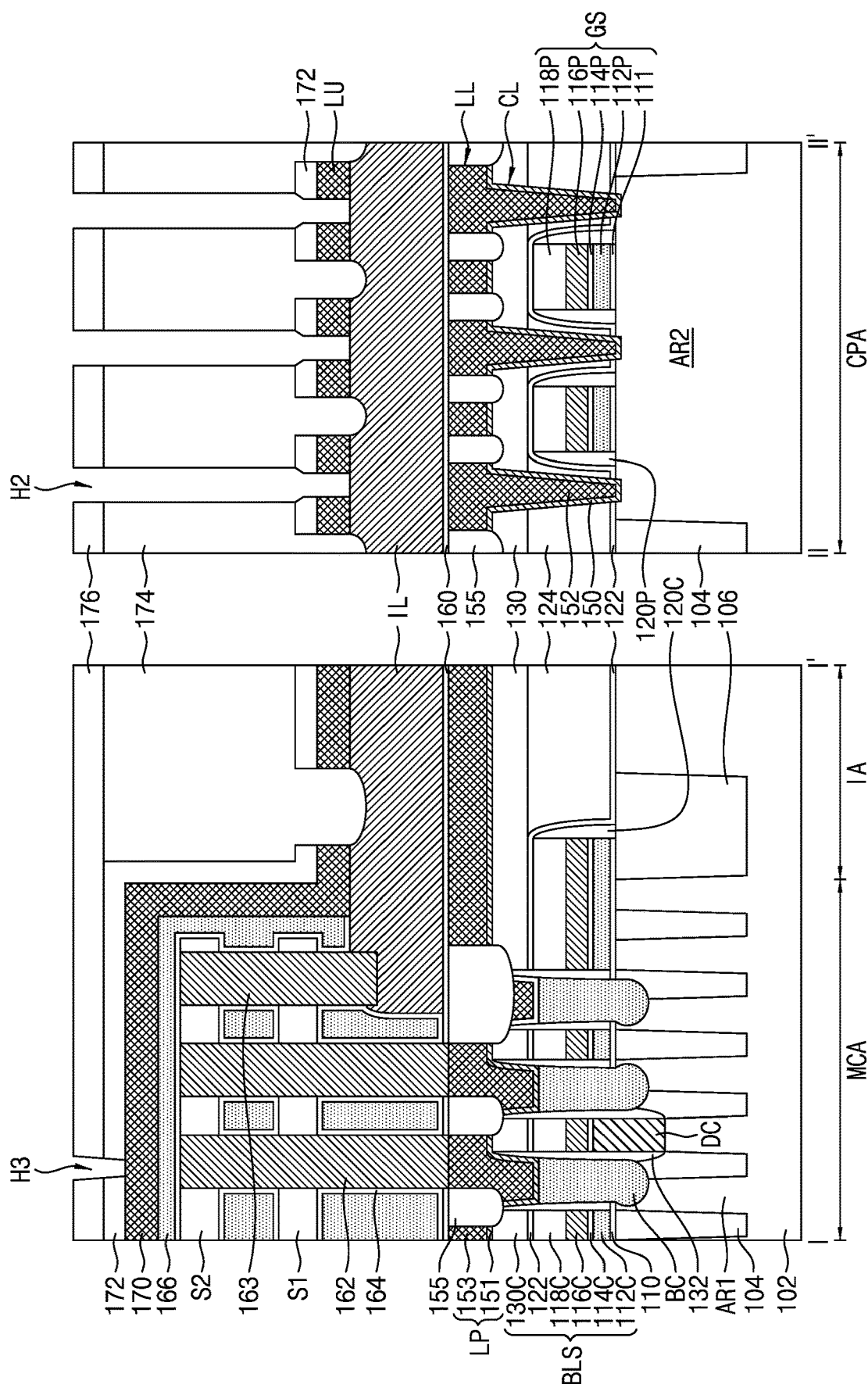

Referring to FIG. 25, a second contact hole H2 and a third contact hole H3 extending through the upper interlayer insulating layer 174 and the insulating layer 176 may be formed. The second contact hole H2 may expose side surfaces of the upper wiring layer LU and the upper insulating layer 172 and the upper surface of the wiring insulating layer IL. The horizontal width of the second contact hole H2 at the upper wiring layer LU and the upper insulating layer 172 may be smaller than the horizontal width of the second contact hole H2 at the upper interlayer insulating layer 174. Formation of the second contact hole H2 may be performed by an anisotropic etching process using, as an etch mask, a hard mask exposing a portion of the insulating layer 176 corresponding to the second contact hole H2. In an embodiment, formation of the second contact hole H2 may further include etching the upper wiring layer LU by a wet etching process. In an embodiment, at least one of second contact holes H2 may have a smaller horizontal width than the remaining second contact holes H2. For example, a part of the second contact holes H2 may have a relatively small horizontal width, and may incompletely extend through the upper wiring layer LU, as in the fourth upper contact plug CU4 shown in FIG. 6.

The third contact hole H3 may expose the plate layer 170. In an embodiment, the horizontal width of the third contact hole H3 may be different from the horizontal width of the second contact hole H2. For example, the horizontal width of the third contact hole H3 may be smaller than the horizontal width of the second contact hole H2. The third contact hole H3 may be formed simultaneously with or separately from the second contact hole H2.

Figure 26:
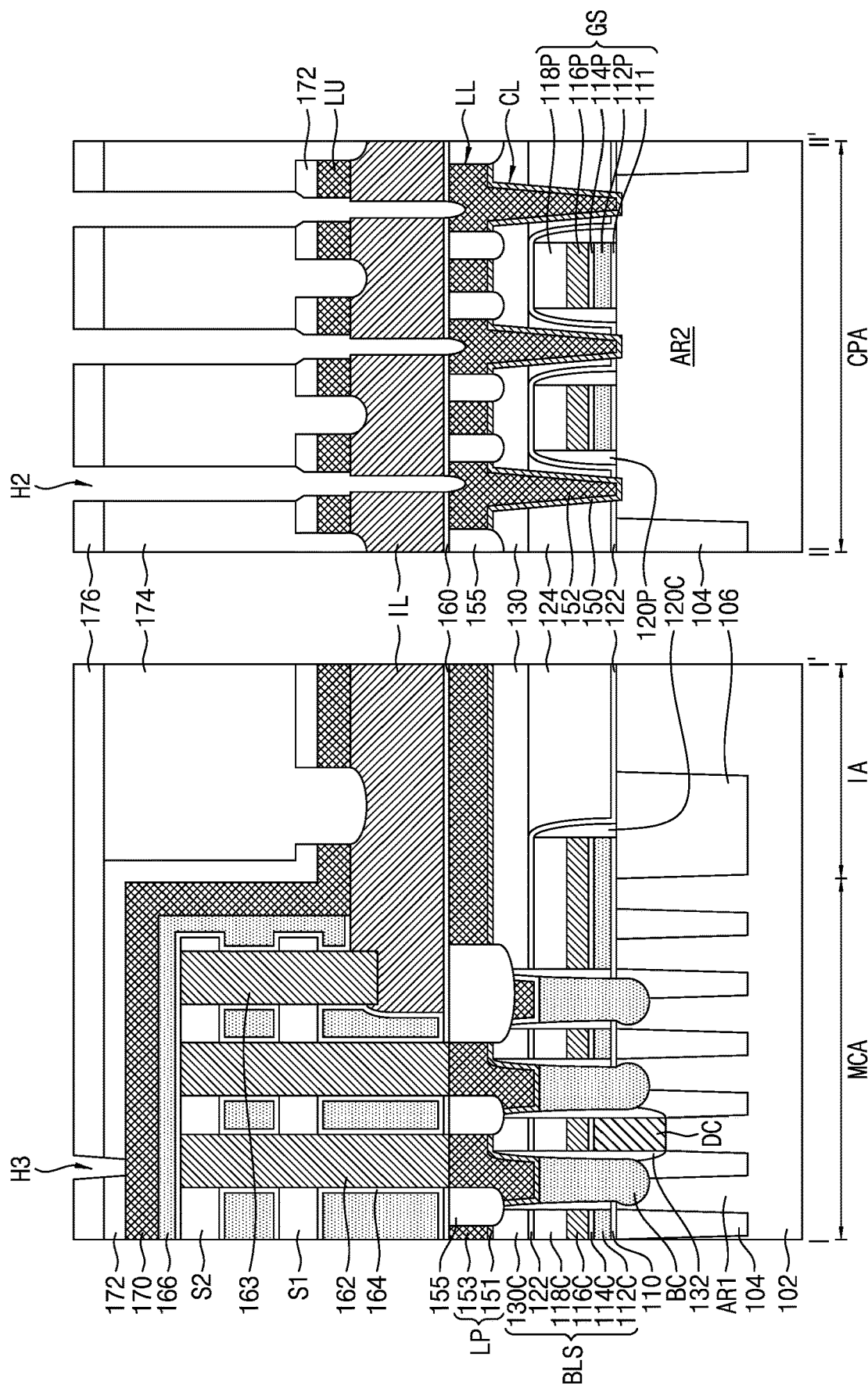

Referring to FIG. 26, the second contact hole H2 may be further extended downwards by an anisotropic etching process and, as such, may extend through the wiring insulating layer IL and the etch stop layer 160, thereby exposing the lower wiring layer LL. The second contact hole H2 may expose both the lower wiring layer LL and the upper wiring layer LU, without being limited thereto. In an embodiment, when the etching process is performed using a hard mask preventing at least one of the second contact holes H2 from being exposed, a part of the second contact holes H2 may not extend through the wiring insulating layer IL, as in the third upper contact plug CU3 shown in FIG. 4.

Figure 27:
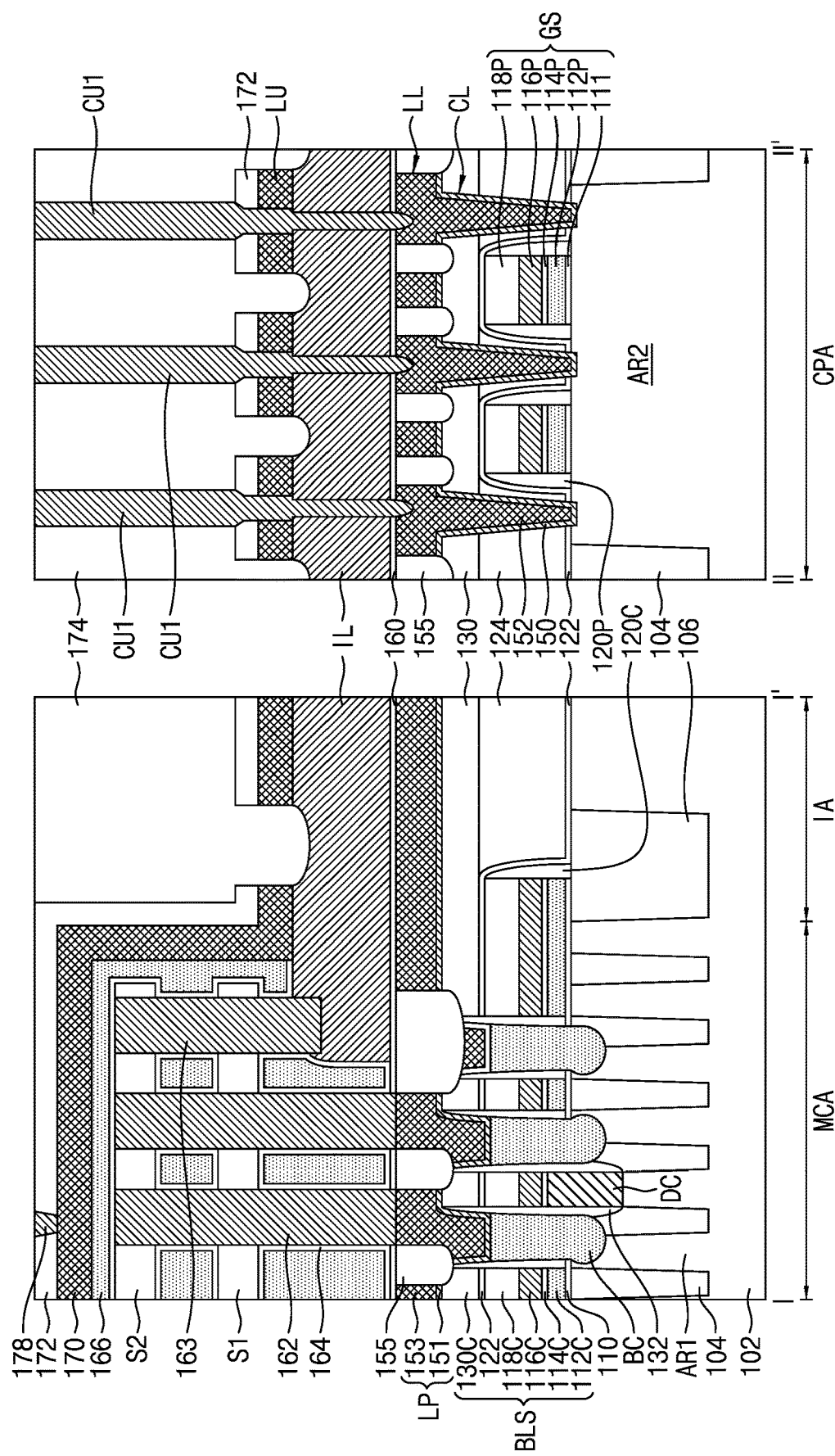

Referring to FIG. 27, a conductive material may fill the second contact hole H2 and the third contact hole H3, thereby forming first upper contact plugs CU1 and a capacitor contact plug 178. The conductive material may include or may be formed of, for example, a metal such as Ti, W, Ni, Co, etc. or a metal nitride such as TiN, TiSiN, TiAlN, TaN, TaSiN, WN, etc. In an embodiment, the first upper contact plugs CU1 and the capacitor contact plug 178 may include or may be formed of tungsten (W). After formation of the first upper contact plugs CU1 and the capacitor contact plug 178, the insulating layer 176 may be removed by a planarization process. An upper surface of a portion of the upper insulating layer 172 may be coplanar with an upper surface of the upper interlayer insulating layer 174.

Again referring to FIG. 2, an insulating layer 180 may be formed on the upper insulating layer 172 and the upper interlayer insulating layer 174. Subsequently, the insulating layer 180 may be etched to expose the first upper contact plugs CU1 and the capacitor contact plug 178, and filling of a conductive material may then be performed, thereby forming contact plugs 182 and 183 and wiring patterns 184 and 185. The wiring patterns 184 may be electrically connected to the first upper contact plugs CU1 via the contact plugs 182. The wiring pattern 185 may be electrically connected to the upper electrode 166 and the plate layer 170 via the contact plug 183.

Figure 28:
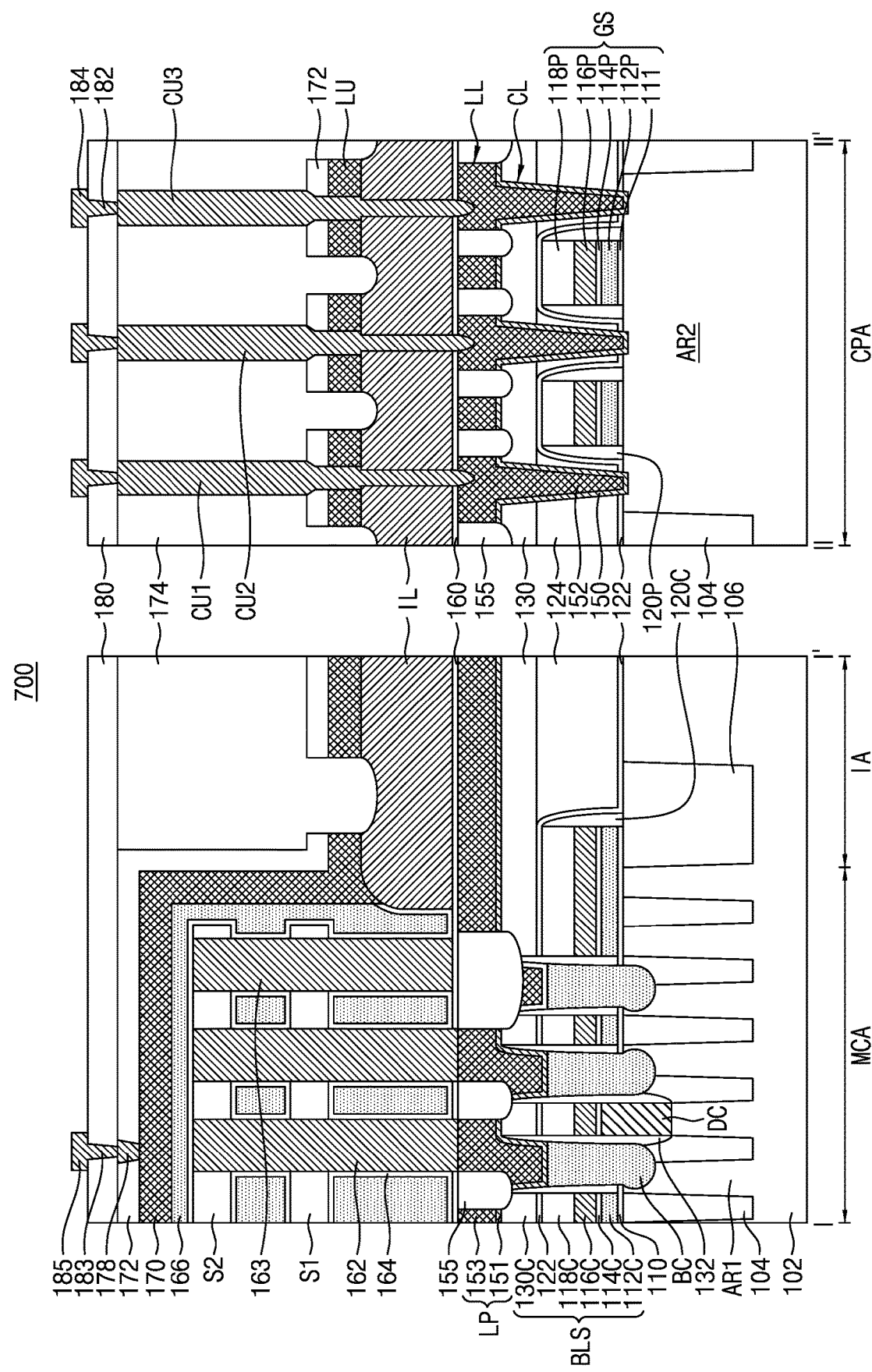
FIGS. 28 and 29 are vertical cross-sectional views of semiconductor devices according to example embodiments of the inventive concepts.
Figure 29:
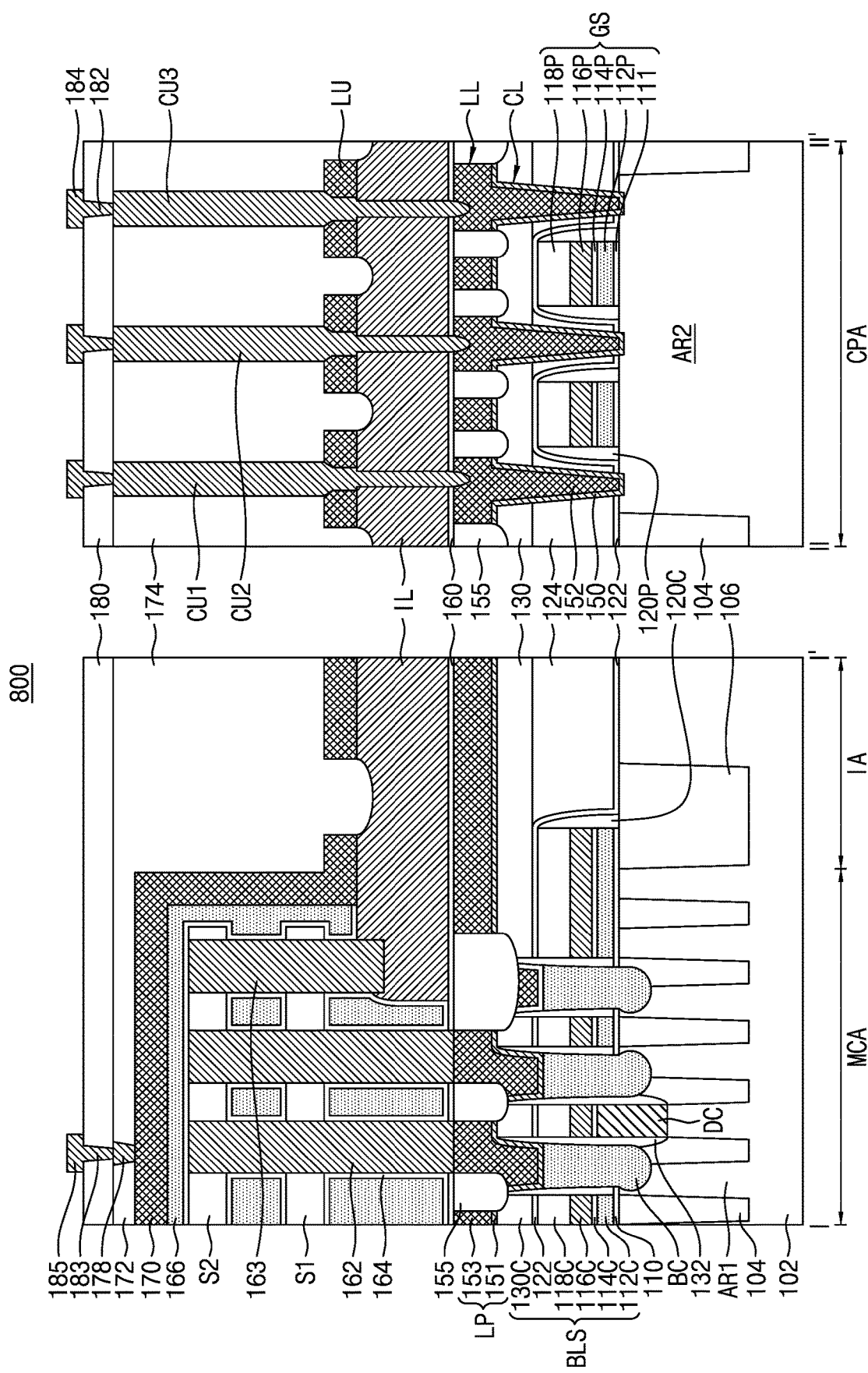

FIGS. 28 and 29 are vertical cross-sectional views of semiconductor devices according to example embodiments of the inventive concepts.

Referring to FIG. 28, a semiconductor device 700 may include a wiring insulating layer IL between a lower wiring layer LL and an upper wiring layer LU. The wiring insulating layer IL may be disposed in an interface area IA and a peripheral circuit area CPA. In an embodiment, the wiring insulating layer IL may not contact a dummy electrode 163. For example, the wiring insulating layer IL may not overlap with the dummy electrode 163 in a vertical direction, and may be spaced apart from the dummy electrode 163 in a horizontal direction. An upper electrode 166 may be filled between the wiring insulating layer IL and the dummy electrode 163, and the wiring insulating layer IL may overlap with the upper electrode 166 in the vertical direction. In an embodiment, the wiring insulating layer IL may not overlap with the upper electrode 166 in the vertical direction, and may be spaced apart from the upper electrode 166 in the horizontal direction.

Referring to FIG. 29, a semiconductor device 800 may include a plate layer 170, an upper wiring layer LU, and an upper interlayer insulating layer 174. In an embodiment, the upper insulating layer 172 of the semiconductor device 100 shown in FIG. 2 may be omitted. The plate layer 170 and the upper wiring layer LU may contact the upper interlayer insulating layer 174.

In accordance with the exemplary embodiments of the disclosure, the semiconductor device may include an upper wiring layer on a lower wiring layer and, as such, freedom of design of a line may be enhanced, and the size of the device may be reduced.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:
1. A semiconductor device comprising:
   a substrate extending in a horizontal direction, and including a cell area having a first active region and a peripheral circuit area having a second active region;
   a bit line structure disposed on the substrate in the cell area;
   a capacitor structure electrically connected to the first active region;
   a plate layer covering the capacitor structure;
   a gate structure disposed on the second active region in the peripheral circuit area;
   lower wiring layers disposed on the gate structure and electrically connected to the second active region;
   upper wiring layers disposed on the lower wiring layers;
   a wiring insulating layer disposed between the lower wiring layers and the upper wiring layers; and
   upper contact plugs connected to at least one of the lower wiring layers and the upper wiring layers,
   wherein the plate layer includes the same material as the upper wiring layers.
2. The semiconductor device according to claim 1, wherein the capacitor structure includes a lower electrode, a capacitor dielectric layer on the lower electrode, and an upper electrode covering the capacitor dielectric layer, and the plate layer covers the upper electrode.

3. The semiconductor device according to claim 2, wherein the upper electrode includes a material different from that of the plate layer.

4. The semiconductor device according to claim 3, wherein the plate layer includes tungsten.

5. The semiconductor device according to claim 2, wherein upper surfaces of the upper wiring layers are at a lower level than an upper surface of the upper electrode, and
wherein upper surfaces of the lower wiring layers are at an upper level than an upper surface of the bit line structure.

6. The semiconductor device according to claim 1, wherein the plate layer includes a first portion extending in the horizontal direction and covering an upper surface of the capacitor structure, and a second portion extending in a vertical direction and covering a side surface of the capacitor structure, and
a lower surface of the second portion is disposed at the same level as lower surfaces of the upper wiring layers in the vertical direction.

7. The semiconductor device according to claim 6, wherein the plate layer further includes a third portion extending from the second portion in the horizontal direction, and a lower surface of the third portion is disposed at the same level the lower surface of the second portion in the vertical direction.

8. The semiconductor device according to claim 1, wherein the wiring insulating layer includes a plurality of first recesses on an upper surface thereof, and
the plurality of first recesses are disposed between the upper wiring layers.

9. The semiconductor device according to claim 8, wherein lower ends of the plurality of first recesses are at lower level than lower surfaces of the upper wiring layers.

10. The semiconductor device according to claim 8, wherein the wiring insulating layer further includes a second recess on the upper surface thereof, and
the second recess is disposed adjacent the plate layer.

11. The semiconductor device according to claim 1, wherein:
the lower wiring layers include a first lower wiring layer;
the upper wiring layers include a first upper wiring layer; and
the upper contact plugs include a first upper contact plug connected to the first upper wiring layer and the first lower wiring layer, and the upper contact plugs further include a second upper contact plug connected to the first upper wiring layer.

12. The semiconductor device according to claim 1, further comprising:
an upper insulating layer on the plate layer and the upper wiring layers.

13. The semiconductor device according to claim 12, wherein the upper insulating layer includes a first upper insulating layer covering the plate layer and second upper insulating layers covering each of the upper wiring layers, and the upper contact plugs pass through the upper insulating layer.

14. The semiconductor device according to claim 12, further comprising:
a capacitor contact plug passes through the upper insulating layer and connected to the plate layer.

15. The semiconductor device according to claim 14, wherein an upper surface of the capacitor contact plug is coplanar with upper surfaces of the upper contact plugs.

16. A semiconductor device comprising:
a substrate extending in a horizontal direction, and including a cell area having a first active region and a peripheral circuit area having a second active region;
a bit line structure electrically connected to a first portion of the first active region;
a capacitor structure electrically connected to a second portion of the first active region;
a gate structure disposed on the second active region in the peripheral circuit area;
lower wiring layers disposed on the gate structure;
upper wiring layers disposed on the lower wiring layers;
a wiring insulating layer disposed between the lower wiring layers and the upper wiring layers;
an upper interlayer insulating layer including a first insulating portion disposed on the upper wiring layers and a second insulating portion extending from the first insulating portion and between the upper wiring layers; and
upper contact plugs pass through the first insulating portion and connected to the upper wiring layers,
wherein a lower end of the second insulating portion is at a lower level than lower surfaces of the upper wiring layers.

17. The semiconductor device according to claim 16, further comprising:
a plate layer covering the capacitor structure,
wherein the plate layer includes the same material as the upper wiring layers.

18. The semiconductor device according to claim 16, wherein the lower end of the second insulating portion is at a higher level than upper surfaces of the lower wiring layers.

19. The semiconductor device according to claim 16, further comprising:
an insulating structure between the lower wiring layers,
wherein a lower end of the insulating structure is at a lower level than lower surfaces of the lower wiring layers.

20. The semiconductor device according to claim 19, wherein the insulating structure includes a material different from that of the wiring insulating layer.

21. The semiconductor device according to claim 16, further comprising:
a lower contact plug connected to at least one of the lower wiring layers,
wherein the at least one of the lower wiring layers are electrically connected to the second active region through the lower contact plug.

* * * * *